United States Patent
Costa et al.

(10) Patent No.: US 10,636,720 B2
(45) Date of Patent: Apr. 28, 2020

(54) WAFER-LEVEL PACKAGE WITH ENHANCED PERFORMANCE

(71) Applicant: Qorvo US, Inc., Greensboro, NC (US)

(72) Inventors: Julio C. Costa, Oak Ridge, NC (US); Jan Edward Vandemeer, Kernersville, NC (US); Jonathan Hale Hammond, Oak Ridge, NC (US); Merrill Albert Hatcher, Jr., Greensboro, NC (US); Jon Chadwick, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 22 days.

(21) Appl. No.: 16/168,327

(22) Filed: Oct. 23, 2018

(65) Prior Publication Data
US 2019/0057922 A1 Feb. 21, 2019

Related U.S. Application Data

(63) Continuation of application No. 15/676,621, filed on Aug. 14, 2017, now Pat. No. 10,109,550.
(Continued)

(51) Int. Cl.
*H01L 23/58* (2006.01)
*H01L 23/31* (2006.01)
(Continued)

(52) U.S. Cl.
CPC .... *H01L 23/3192* (2013.01); *H01L 21/02214* (2013.01); *H01L 21/568* (2013.01);
(Continued)

(58) Field of Classification Search
USPC ... 257/E23.141–E23.179, 41, 81, 82, 91, 99, 257/177–182, 276, 457, 459, 573, 584,
(Continued)

(56) References Cited

U.S. PATENT DOCUMENTS

| 4,093,562 A | 6/1978 | Kishimoto |
| 4,366,202 A | 12/1982 | Borovsky |

(Continued)

FOREIGN PATENT DOCUMENTS

| CN | 103811474 A | 5/2014 |
| CN | 103872012 A | 6/2014 |

(Continued)

OTHER PUBLICATIONS

Notice of Allowance for U.S. Appl. No. 15/287,273, dated Jun. 30, 2017, 8 pages.

(Continued)

*Primary Examiner* — Niki H Nguyen
(74) *Attorney, Agent, or Firm* — Withrow & Terranova, P.L.L.C.

(57) ABSTRACT

The present disclosure relates to a packaging process to enhance thermal and electrical performance of a wafer-level package. The wafer-level package with enhanced performance includes a first thinned die having a first device layer, a multilayer redistribution structure, a first mold compound, and a second mold compound. The multilayer redistribution structure includes package contacts on a bottom surface of the multilayer redistribution structure and redistribution interconnects connecting the first device layer to the package contacts. The first mold compound resides over the multilayer redistribution structure and around the first thinned die, and extends beyond a top surface of the first thinned die to define a cavity within the first mold compound and over the first thinned die. The second mold compound fills the cavity and is in contact with the top surface of the first thinned die.

17 Claims, 18 Drawing Sheets

Related U.S. Application Data

Figure 3:
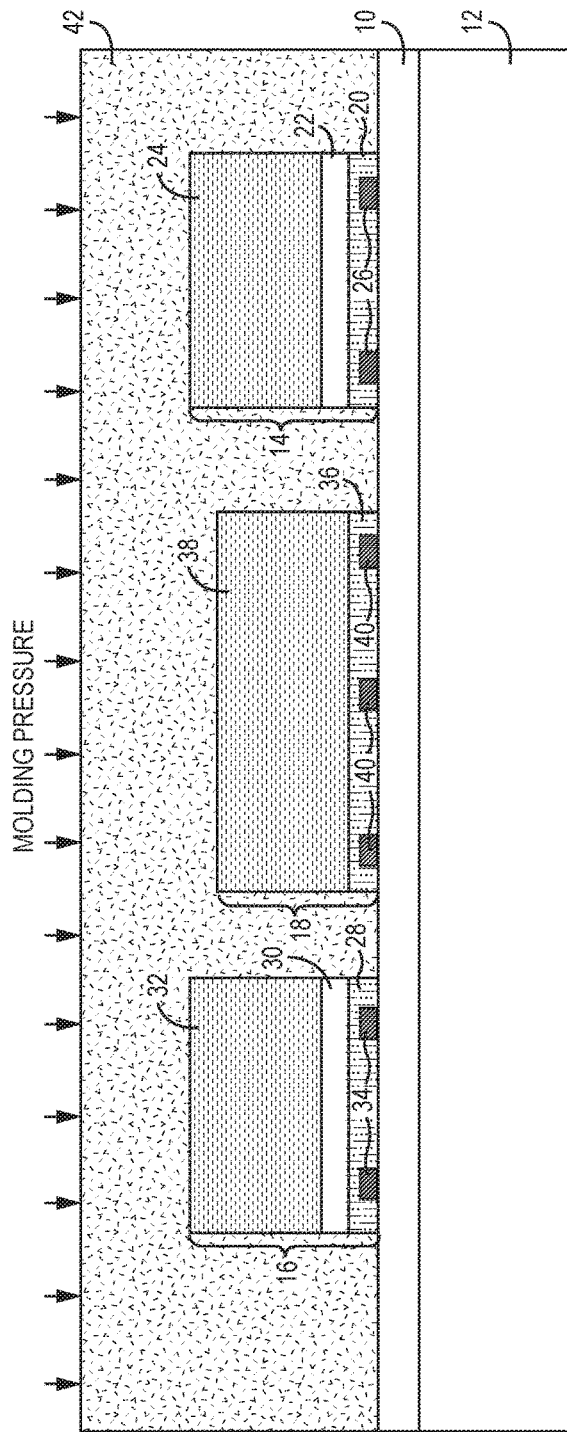

(60) Provisional application No. 62/374,318, filed on Aug. 12, 2016, provisional application No. 62/374,332, filed on Aug. 12, 2016, provisional application No. 62/374,439, filed on Aug. 12, 2016.

(51) Int. Cl.
*H01L 21/02* (2006.01)
*H01L 23/34* (2006.01)
*H01L 23/532* (2006.01)
*H01L 23/433* (2006.01)
*H01L 21/56* (2006.01)
*H01L 23/538* (2006.01)
*H01L 23/00* (2006.01)
H01L 23/498 (2006.01)
H01L 23/544 (2006.01)

(52) U.S. Cl.
CPC .......... *H01L 23/3135* (2013.01); *H01L 23/34* (2013.01); *H01L 23/4334* (2013.01); *H01L 23/5329* (2013.01); *H01L 23/5389* (2013.01); *H01L 24/19* (2013.01); *H01L 24/96* (2013.01); H01L 21/561 (2013.01); H01L 23/49811 (2013.01); H01L 23/49827 (2013.01); H01L 23/544 (2013.01); H01L 24/97 (2013.01); H01L 2223/54486 (2013.01); H01L 2224/01 (2013.01); H01L 2224/04105 (2013.01); H01L 2224/12105 (2013.01); H01L 2224/24137 (2013.01); H01L 2224/24195 (2013.01); H01L 2924/1461 (2013.01); H01L 2924/18162 (2013.01); H01L 2924/19011 (2013.01); H01L 2924/19105 (2013.01)

(58) Field of Classification Search
USPC ................ 257/602, 621, 502–503, 664–677, 257/688–700, 734–786; 438/584, 438/597–688, 83, 98, 100, 101, 111, 112, 438/123, 124, 411, 412, 461
See application file for complete search history.

(56) References Cited

U.S. PATENT DOCUMENTS

| | | | |
|---|---|---|---|
| 5,013,681 A | 5/1991 | Godbey et al. | |
| 5,061,663 A | 10/1991 | Bolt et al. | |
| 5,069,626 A | 12/1991 | Patterson et al. | |
| 5,362,972 A | 11/1994 | Yazawa et al. | |
| 5,391,257 A | 2/1995 | Sullivan et al. | |
| 5,459,368 A | 10/1995 | Onishi et al. | |
| 5,646,432 A | 7/1997 | Iwaki et al. | |
| 5,648,013 A | 7/1997 | Uchida et al. | |
| 5,699,027 A | 12/1997 | Tsuji et al. | |
| 5,709,960 A | 1/1998 | Mays et al. | |
| 5,729,075 A | 3/1998 | Strain | |
| 5,831,369 A | 11/1998 | Fürbacher et al. | |
| 5,920,142 A | 7/1999 | Onishi et al. | |
| 6,072,557 A | 6/2000 | Kishimoto | |
| 6,084,284 A | 7/2000 | Adamic, Jr. | |
| 6,154,366 A | 11/2000 | Ma et al. | |
| 6,154,372 A | 11/2000 | Kalivas et al. | |
| 6,235,554 B1 | 5/2001 | Akram et al. | |
| 6,236,061 B1 | 5/2001 | Walpita | |
| 6,268,654 B1 | 7/2001 | Glenn et al. | |
| 6,271,469 B1 | 8/2001 | Ma et al. | |
| 6,377,112 B1 | 4/2002 | Rozsypal | |
| 6,423,570 B1 | 7/2002 | Ma et al. | |
| 6,426,559 B1 | 7/2002 | Bryan et al. | |
| 6,446,316 B1 | 9/2002 | Fürbacher et al. | |
| 6,578,458 B1 | 6/2003 | Akram et al. | |
| 6,649,012 B2 | 11/2003 | Masayuki et al. | |
| 6,713,859 B1 | 3/2004 | Ma | |
| 6,841,413 B2 | 1/2005 | Liu et al. | |
| 6,864,156 B1 | 3/2005 | Conn | |
| 6,902,950 B2 | 6/2005 | Ma et al. | |
| 6,943,429 B1 | 9/2005 | Glenn et al. | |
| 6,964,889 B2 | 11/2005 | Ma et al. | |
| 6,992,400 B2 | 1/2006 | Tikka et al. | |
| 7,042,072 B1 | 5/2006 | Kim et al. | |
| 7,049,692 B2 | 5/2006 | Nishimura et al. | |
| 7,109,635 B1 | 9/2006 | McClure et al. | |
| 7,183,172 B2 | 2/2007 | Lee et al. | |
| 7,238,560 B2 | 7/2007 | Sheppard et al. | |
| 7,279,750 B2 | 10/2007 | Jobetto | |
| 7,288,435 B2 | 10/2007 | Aigner et al. | |
| 7,307,003 B2 | 12/2007 | Reif et al. | |
| 7,393,770 B2 | 7/2008 | Wood et al. | |
| 7,427,824 B2 | 9/2008 | Iwamoto et al. | |
| 7,489,032 B2 | 2/2009 | Jobetto | |
| 7,596,849 B1 | 10/2009 | Carpenter et al. | |
| 7,619,347 B1 | 11/2009 | Bhattacharjee | |
| 7,635,636 B2 | 12/2009 | McClure et al. | |
| 7,714,535 B2 | 5/2010 | Yamazaki et al. | |
| 7,749,882 B2 | 7/2010 | Kweon et al. | |
| 7,790,543 B2 | 9/2010 | Abadeer et al. | |
| 7,843,072 B1 | 11/2010 | Park et al. | |
| 7,855,101 B2 | 12/2010 | Furman et al. | |
| 7,868,419 B1 | 1/2011 | Kerr et al. | |
| 7,910,405 B2 | 3/2011 | Okada et al. | |
| 7,960,218 B2 | 6/2011 | Ma et al. | |
| 8,004,089 B2 | 8/2011 | Jobetto | |
| 8,183,151 B2 | 5/2012 | Lake | |
| 8,420,447 B2 | 4/2013 | Tay et al. | |
| 8,503,186 B2 | 8/2013 | Lin et al. | |
| 8,643,148 B2 | 2/2014 | Lin et al. | |
| 8,658,475 B1 | 2/2014 | Kerr | |
| 8,664,044 B2 | 3/2014 | Jin et al. | |
| 8,772,853 B2 | 7/2014 | Hong et al. | |
| 8,791,532 B2 | 7/2014 | Graf et al. | |
| 8,802,495 B2 | 8/2014 | Kim et al. | |
| 8,803,242 B2 | 8/2014 | Marino et al. | |
| 8,816,407 B2 * | 8/2014 | Kim ................ H01L 23/481 257/260 |
| 8,835,978 B2 | 9/2014 | Mauder et al. | |
| 8,906,755 B1 | 12/2014 | Hekmatshoartabari et al. | |
| 8,921,990 B2 | 12/2014 | Park et al. | |
| 8,927,968 B2 | 1/2015 | Cohen et al. | |
| 8,941,248 B2 | 1/2015 | Lin et al. | |
| 8,963,321 B2 | 2/2015 | Lenniger et al. | |
| 8,983,399 B2 | 3/2015 | Kawamura et al. | |
| 9,165,793 B1 | 10/2015 | Wang et al. | |
| 9,214,337 B2 | 12/2015 | Carroll et al. | |
| 9,349,700 B2 | 5/2016 | Hsieh et al. | |
| 9,368,429 B2 | 6/2016 | Ma et al. | |
| 9,461,001 B1 | 10/2016 | Tsai et al. | |
| 9,520,428 B2 | 12/2016 | Fujimori | |
| 9,530,709 B2 | 12/2016 | Leipold et al. | |
| 9,613,831 B2 | 4/2017 | Morris et al. | |
| 9,646,856 B2 | 5/2017 | Meyer et al. | |
| 9,653,428 B1 | 5/2017 | Hiner et al. | |
| 9,786,586 B1 | 10/2017 | Shih | |
| 9,812,350 B2 | 11/2017 | Costa | |
| 9,824,951 B2 | 11/2017 | Leipold et al. | |
| 9,824,974 B2 * | 11/2017 | Gao ................ H01L 23/49827 |
| 9,859,254 B1 * | 1/2018 | Yu ................ H01L 24/83 |
| 9,875,971 B2 | 1/2018 | Bhushan et al. | |
| 9,941,245 B2 | 4/2018 | Skeete et al. | |
| 2001/0004131 A1 | 6/2001 | Masayuki et al. | |
| 2002/0070443 A1 | 6/2002 | Mu et al. | |
| 2002/0074641 A1 | 6/2002 | Towle et al. | |
| 2002/0127769 A1 | 9/2002 | Ma et al. | |
| 2002/0127780 A1 | 9/2002 | Ma et al. | |
| 2002/0137263 A1 | 9/2002 | Towle et al. | |
| 2002/0185675 A1 | 12/2002 | Furukawa | |
| 2003/0207515 A1 | 11/2003 | Tan et al. | |
| 2004/0164367 A1 | 8/2004 | Park | |
| 2004/0166642 A1 | 8/2004 | Chen et al. | |
| 2004/0219765 A1 | 11/2004 | Reif et al. | |
| 2005/0037595 A1 | 2/2005 | Nakahata | |
| 2005/0079686 A1 | 4/2005 | Aigner et al. | |
| 2005/0212419 A1 | 9/2005 | Vazan et al. | |

(56) References Cited

U.S. PATENT DOCUMENTS

| | | |
|---|---|---|
| 2006/0057782 A1 | 3/2006 | Gardes et al. |
| 2006/0105496 A1 | 5/2006 | Chen et al. |
| 2006/0108585 A1 | 5/2006 | Gan et al. |
| 2006/0228074 A1 | 10/2006 | Lipson et al. |
| 2006/0261446 A1 | 11/2006 | Wood et al. |
| 2007/0020807 A1 | 1/2007 | Geefay et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0265978 A1 | 10/2008 | Englekirk |
| 2008/0272497 A1 | 11/2008 | Lake |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0179266 A1 | 7/2009 | Abadeer et al. |
| 2009/0261460 A1 | 10/2009 | Kuan et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0120204 A1 | 5/2010 | Kunimoto |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1* | 2/2013 | Meyer .............. H01L 23/3107 257/773 |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0015131 A1 | 1/2014 | Meyer et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1* | 11/2014 | Jung .................. H01L 24/96 257/774 |
| 2014/0346573 A1 | 11/2014 | Adam et al. |
| 2014/0356602 A1 | 12/2014 | Oh et al. |
| 2015/0015321 A1 | 1/2015 | Dribinsky et al. |
| 2015/0108666 A1 | 4/2015 | Engelhardt et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabari et al. |
| 2016/0002510 A1 | 1/2016 | Champagne et al. |
| 2016/0079137 A1 | 3/2016 | Leipold et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0343592 A1* | 11/2016 | Costa .................. H01L 23/3135 |
| 2016/0343604 A1 | 11/2016 | Costa et al. |
| 2016/0347609 A1 | 12/2016 | Yu et al. |
| 2016/0362292 A1 | 12/2016 | Chang et al. |
| 2017/0024503 A1 | 1/2017 | Connelly |
| 2017/0032957 A1 | 2/2017 | Costa et al. |
| 2017/0053938 A1 | 2/2017 | Whitefield |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0207350 A1 | 7/2017 | Leipold et al. |
| 2017/0263539 A1 | 9/2017 | Gowda et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |
| 2017/0358511 A1 | 12/2017 | Costa et al. |
| 2018/0019184 A1 | 1/2018 | Costa et al. |
| 2018/0019185 A1 | 1/2018 | Costa et al. |
| 2018/0044169 A1 | 2/2018 | Hatcher, Jr. et al. |
| 2018/0044177 A1 | 2/2018 | Vandemeer et al. |
| 2018/0047653 A1 | 2/2018 | Costa et al. |
| 2018/0138082 A1 | 5/2018 | Costa et al. |
| 2018/0145678 A1 | 5/2018 | Maxim et al. |
| 2018/0166358 A1 | 6/2018 | Costa et al. |
| 2018/0269188 A1 | 9/2018 | Yu et al. |
| 2019/0172842 A1 | 6/2019 | Whitefield |
| 2019/0189599 A1 | 6/2019 | Baloglu et al. |

FOREIGN PATENT DOCUMENTS

| | | | |
|---|---|---|---|
| EP | 2996143 A1 | 3/2016 | |
| JP | S505733 Y1 | 2/1975 | |
| JP | H11220077 A | 8/1999 | |
| JP | 200293957 A | 3/2002 | |
| JP | 2002252376 A | 9/2002 | |
| JP | 2006005025 A | 1/2006 | |
| JP | 2007227439 A | 9/2007 | |
| JP | 2008235490 A | 10/2008 | |
| JP | 2008279567 A | 11/2008 | |

(56) References Cited

FOREIGN PATENT DOCUMENTS

| JP | 2009026880 A | 2/2009 |
|---|---|---|
| JP | 2009530823 A | 8/2009 |
| JP | 2011243596 A | 12/2011 |
| WO | 2007074651 A1 | 7/2007 |

OTHER PUBLICATIONS

Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created dated Feb. 22, 2013, 58 pages.
Office Action for Japanese Patent Application No. 2011-229152, dated May 10, 2013, 7 pages
Final Rejection for Japanese Patent Application No. 2011-229152, dated Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.

Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Supplemental Notice of Allowability for U.S. Appl. No. 15/287,273, dated Jan. 17, 2018, 5 pages.
Notice of Allowance for U.S. Appl. No. 15/498,040, dated Feb. 20, 2018, 8 pages.
Non-Final Office Action for U.S. Appl. No. 15/387,855, dated Jan. 16, 2018, 7 pages.
Non-Final Office Action for U.S. Appl. No. 15/795,915, dated Feb. 23, 2018, 6 pages.
International Preliminary Report on Patentability for PCT/US20161045809, dated Feb. 22, 2018, 8 pages.
Advisory Action and Applicant-Initiated Feb. 28, 2018, 5 pages Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Non-Final Office Action for U.S. Appl. No. 15/676,415, dated Mar. 27, 2018, 14 page.
Non-Final Office Action for U.S. Appl. No. 15/676,621, dated Mar. 26, 2018, 16 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Non-Final Office Action for U.S. Appl. No. 15/676,693, dated May 3, 2018, 14 pages.
Notice of Allowance for U.S. Appl. No. 15/789,107, dated May 18, 2018, 8 pages.
Final Office Action for U.S. Appl. No. 15/616,109, dated Apr. 19, 2018, 18 pages.
Notice of Allowance for U.S. Appl. No. 15/676,693, dated Jul. 20, 2018, 8 pages.
Notice of Allowance for U.S. Appl. No. 15/695,629, dated Jul. 11, 2018, 12 pages.
Notice of Allowance for U.S. Appl. No. 15/387,855, dated Aug. 10, 2018, 7 pages.
Notice of Allowance for U.S. Appl. No. 15/914,538, dated Aug. 1, 2018, 9 pages.
Notice of Allowance and Applicant-Initiated Interview Summary for U.S. Appl. No. 15/262,457, dated Sep. 28, 2018, 16 pages.
Corrected Notice of Allowance for U.S. Appl. No. 15/676,693, dated Aug. 29, 2018, 5 pages.
Final Office Action for U.S. Appl. No. 15/601,858, dated Nov. 26, 2018, 16 pages.
Non-Final Office Action for U.S. Appl. No. 15/945,418, dated Nov. 1, 2018, 13 pages.
First Office Action for Chinese Patent Application No. 201510746323.X, dated Nov. 2, 2018, 12 pages.
Advisory Action for U.S. Appl. No. 15/601,858, dated Jan. 22, 2019, 3 pages.
Notice of Allowance for U.S. Appl. No. 16/038,879, dated Jan. 9, 2019, 8 pages.
Notice of Allowance for U.S. Appl. No. 16/004,961, dated Jan. 11, 2019, 8 pages.

(56) References Cited

OTHER PUBLICATIONS

International Preliminary Report on Patentability for PCT/US2017/046744, dated Feb. 21, 2019, 11 pages.
International Preliminary Report on Patentability for PCT/US2017/046758, dated Feb. 21, 2019, 11 pages.
International Preliminary Report on Patentability for PCT/US2017/046779, dated Feb. 21, 2019, 11 pages.
Non-Final Office Action for U.S. Appl. No. 15/992,613, dated Feb. 27, 2019, 15 pages.
Non-Final Office Action for U.S. Appl. No. 15/601,858, dated Apr. 17, 2019, 9 pages.
Notice of Allowance for U.S. Appl. No. 16/004,961, dated May 13, 2019, 8 pages.
Non-Final Office Action for U.S. Appl. No. 15/695,579, dated Jan. 28, 2019, 8 pages.
Notice of Allowance for U.S. Appl. No. 15/695,579, dated Mar. 20, 2019, 8 pages.
Final Office Action for U.S. Appl. No. 15/992,613, dated May 24, 2019, 11 pages.
Notice of Allowance for U.S. Appl. No. 15/992,639, dated May 9, 2019, 7 pages.
Non-Final Office Action for U.S. Appl. No. 15/873,152, dated May 24, 2019, 11 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of the Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.

(56) References Cited

OTHER PUBLICATIONS

Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.

Lederer, Dimitri et al., "Substrate loss mechanisms for microstrip and CPW transmission lines on lossy silicon wafers," Solid-State Electronics, vol. 47, No. 11, Nov. 2003, pp. 1927-1936.

Lee, Kwang Hong et al., "Integration of III-V materials and Si-CMOS through double layer transfer process," Japanese Journal of Applied Physics, vol. 54, Jan. 2015, pp. 030209-1 to 030209-5.

Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.

Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.

Mamunya, Yep., et al., "Electrical and Thermal Conductivity of Polymers Filled with Metal Powders," European Polymer Journal, vol. 38, 2002, pp. 1887-1897.

Mansour, Raafat R., "RF MEMS-CMOS Device Integration," IEEE Microwave Magazine, vol. 14, No. 1, Jan. 2013, pp. 39-56.

Mazuré, C. et al., "Advanced SOI Substrate Manufacturing," 2004 IEEE International Conference on Integrated Circuit Design and Technology, 2004, IEEE, pp. 105-111.

Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.

Morris, Art, "Monolithic Integration of RF-MEMS within CMOS," 2015 International Symposium on VLSI Technology, Systems and Application (VLSI-TSA), Apr. 27-29, 2015, IEEE, 2 pages.

Niklaus, F., et al., "Adhesive Wafer Bonding," Journal of Applied Physics, vol. 99, No. 3, 031101 (2006), 28 pages.

Parthasarathy, S., et al., "RF SOI Switch FET Design and Modeling Tradeoffs for GSM Applications," 2010 23rd International Conference on VLSI Design, (VLSID '10), Jan. 2010, pp. 194-199.

Raskin, J.P., et al., "Coupling Effects in High-Resistivity SIMOX Substrates for VHF and Microwave Applications," Proceedings of 1995 IEEE International SOI Conference, Oct. 1995, pp. 62-63.

Raskin, Jean-Pierre et al., "Substrate Crosstalk Reduction Using SOI Technology," IEEE Transactions on Electron Devices, vol. 44, No. 12, Dec. 1997, pp. 2252-2261.

Rong, B., et al., "Surface-Passivated High-Resistivity Silicon Substrates for RFICs," IEEE Electron Device Letters, vol. 25, No. 4, Apr. 2004, pp. 176-178.

Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.

Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.

Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.

Non-Final Office Action for U.S. Appl. No. 13/852,648, dated Jul. 18, 2013, 20 pages.

Final Office Action for U.S. Appl. No. 13/852,648, dated Nov. 26, 2013, 21 pages.

Applicant-Initiated Interview Summary for U.S. Appl. No. 13/852,648, dated Jan. 27, 2014, 4 pages.

Advisory Action for U.S. Appl. No. 13/852,648, dated Mar. 7, 2014, 4 pages.

Notice of Allowance for U.S. Appl. No. 13/852,648, dated Jun. 16, 2014, 9 pages.

Notice of Allowance for U.S. Appl. No. 13/852,648, dated Sep. 26, 2014, 8 pages.

Notice of Allowance for U.S. Appl. No. 13/852,648, dated Jan. 22, 2015, 8 pages.

Non-Final Office Action for U.S. Appl. No. 13/852,648, dated Jun. 24, 2015, 20 pages.

Final Office Action for U.S. Appl. No. 13/852,648, dated Oct. 22, 2015, 20 pages.

Non-Final Office Action for U.S. Appl. No. 13/852,648, dated Feb. 19, 2016, 12 pages.

Final Office Action for U.S. Appl. No. 13/852,648, dated Jul. 20, 2016, 14 pages.

Non-Final Office Action for U.S. Appl. No. 14/315,765, dated Jan. 2, 2015, 6 pages.

Final Office Action for U.S. Appl. No. 14/315,765, dated May 11, 2015, 17 pages.

Advisory Action for U.S. Appl. No. 14/315,765, dated Jul. 22, 2015, 3 pages.

Non-Final Office Action for U.S. Appl. No. 14/260,909, dated Mar. 20, 2015, 20 pages.

Final Office Action for U.S. Appl. No. 14/260,909, dated Aug. 12, 2015, 18 pages.

Non-Final Office Action for U.S. Appl. No. 14/261,029, dated Dec. 5, 2014, 15 pages.

Notice of Allowance for U.S. Appl. No. 14/261,029, dated Apr. 27, 2015, 10 pages.

Corrected Notice of Allowability for U.S. Appl. No. 14/261,029, dated Nov. 17, 2015, 5 pages.

Non-Final Office Action for U.S. Appl. No. 14/529,870, dated Feb. 12, 2016, 14 pages.

Notice of Allowance for U.S. Appl. No. 14/529,870, dated Jul. 15, 2016, 8 pages.

Non-Final Office Action for U.S. Appl. No. 15/293,947, dated Apr. 7, 2017, 12 pages.

Notice of Allowance for U.S. Appl. No. 15/293,947, dated Aug. 14, pp. 2017, 7 pages.

Non-Final Office Action for U.S. Appl. No. 14/715,830, dated Apr. 13, 2016, 16 pages.

Final Office Action for U.S. Appl. No. 14/715,830, dated Sep. 6, 2016, 13 pages.

Advisory Action for U.S. Appl. No. 14/715,830, dated Oct. 31, 2016, 6 pages.

Notice of Allowance for U.S. Appl. No. 14/715,830, dated Feb. 10, 2017, 8 pages.

Notice of Allowance for U.S. Appl. No. 14/715,830, dated Mar. 2, 2017, 8 pages.

Non-Final Office Action for U.S. Appl. No. 14/851,652, dated Oct. 7, 2016, 10 pages.

Notice of Allowance for U.S. Appl. No. 14/851,652, dated Apr. 11, 2017, 9 pages.

Corrected Notice of Allowance for U.S. Appl. No. 14/851,652, dated Jul. 24, 2017, 6 pages.

Corrected Notice of Allowance for U.S. Appl. No. 14/851,652, dated Sep. 6, 2017, 5 pages.

Notice of Allowance for U.S. Appl. No. 14/959,129, dated Oct. 11, 2016, 8 pages.

Non-Final Office Action for U.S. Appl. No. 15/173,037, dated Jan. 10, 2017, 8 pages.

Final Office Action for U.S. Appl. No. 15/173,037, dated May 2, 2017, 13 pages.

Advisory Action for U.S. Appl. No. 15/173,037, dated Jul. 20, 2017, 3 pages.

Notice of Allowance for U.S. Appl. No. 15/173,037, dated Aug. 9, 2017, 7 pages.

Non-Final Office Action for U.S. Appl. No. 15/085,185, dated Feb. 15, 2017, 10 pages.

Non-Final Office Action for U.S. Appl. No. 15/085,185, dated Jun. 6, 2017, 5 pages.

Non-Final Office Action for U.S. Appl. No. 15/229,780, dated Jun. 30, 2017, 12 pages.

Non-Final Office Action for U.S. Appl. No. 15/262,457, dated Aug. 7, 2017, 10 pages.

(56) References Cited

OTHER PUBLICATIONS

Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Notice of Allowance for U.S. Appl. No. 16/004,961, dated Aug. 28, 2019, 8 pages.
Notice of Allowance for U.S. Appl. No. 15/601,858, dated Aug. 16, 2019, 8 pages.
Advisory Action for U.S. Appl. No. 15/992,613, dated Jul. 29, 2019, 3 pages.
Final Office Action for U.S. Appl. No. 15/873,152, dated Aug. 8, 2019, 13 pages.
Notice of Allowance for U.S. Appl. No. 15/975,230, dated Jul. 22, 2019, 7 pages.
International Search Report and Written Opinion for International Patent Application No. PCT/US19/25591, dated Jun. 21, 2019, 7 pages.
Notice of Reasons for Refusal for Japanese Patent Application No. 2015-180657, dated Jul. 9, 2019, 4 pages.
International Search Report and Written Opinion for International Patent Application No. PCT/US2019/034645, dated Sep. 19, 2019, 14 pages.
International Search Report and Written Opinion for International Patent Application No. PCT/US2019/034699, dated Oct. 29, 2019, 13 pages.
Non-Final Office Action for U.S. Appl. No. 16/204,214, dated Oct. 9, 2019, 15 pages.
Non-Final Office Action for U.S. Appl. No. 15/816,637, dated Oct. 31, 2019, 10 pages.
Advisory Action for U.S. Appl. No. 15/873,152, dated Oct. 11, 2019, 3 pages.
Office Action for Japanese Patent Application No. 2018-526613, dated Nov. 5, 2019, 8 pages
Notice of Allowance for U.S. Appl. No. 15/873,152, dated Dec. 10, 2019, 9 pages.
Corrected Notice of Allowability for U.S. Appl. No. 15/695,579, dated Feb. 5, 2020, 5 pages.
Non-Final Office Action for U.S. Appl. No. 16/527,702, dated Jan. 10, 2020, 10 pages.
International Search Report and Written Opinion for International Patent Application No. PCT/US2019/055317, dated Feb. 6, 2020, 17 pages.
International Search Report and Written Opinion for International Patent Application No. PCT/US2019/055321, dated Jan. 27, 2020, 23 pages.
Final Office Action for U.S. Appl. No. 16/204,214, dated Mar. 6, 2020, 14 pages.
Intention to Grant for European Patent Application No. 17757646.9, dated Feb. 27, 2020, 55 pages.
International Search Report and Written Opinion for International Patent Application No. PCT/US2019/063460, dated Feb. 25, 2020, 14 pages.

\* cited by examiner

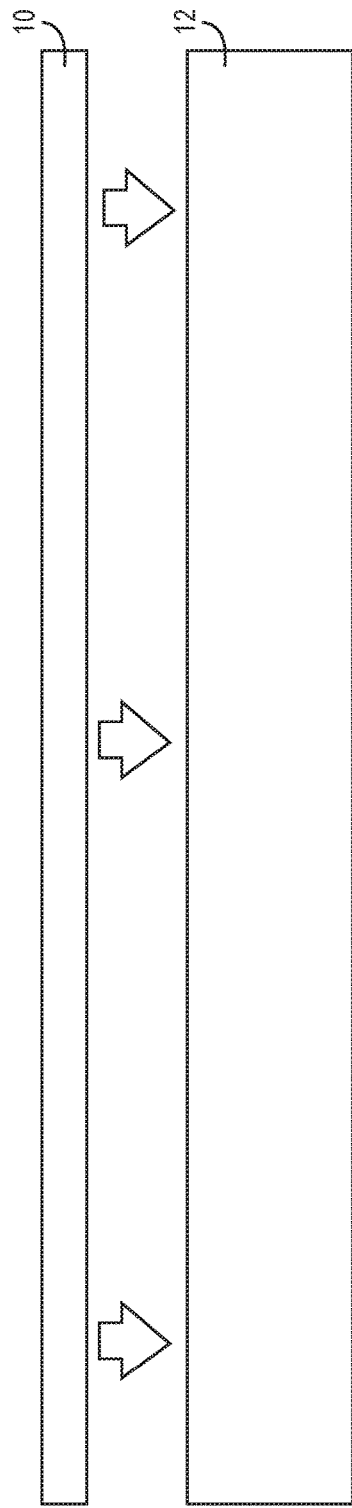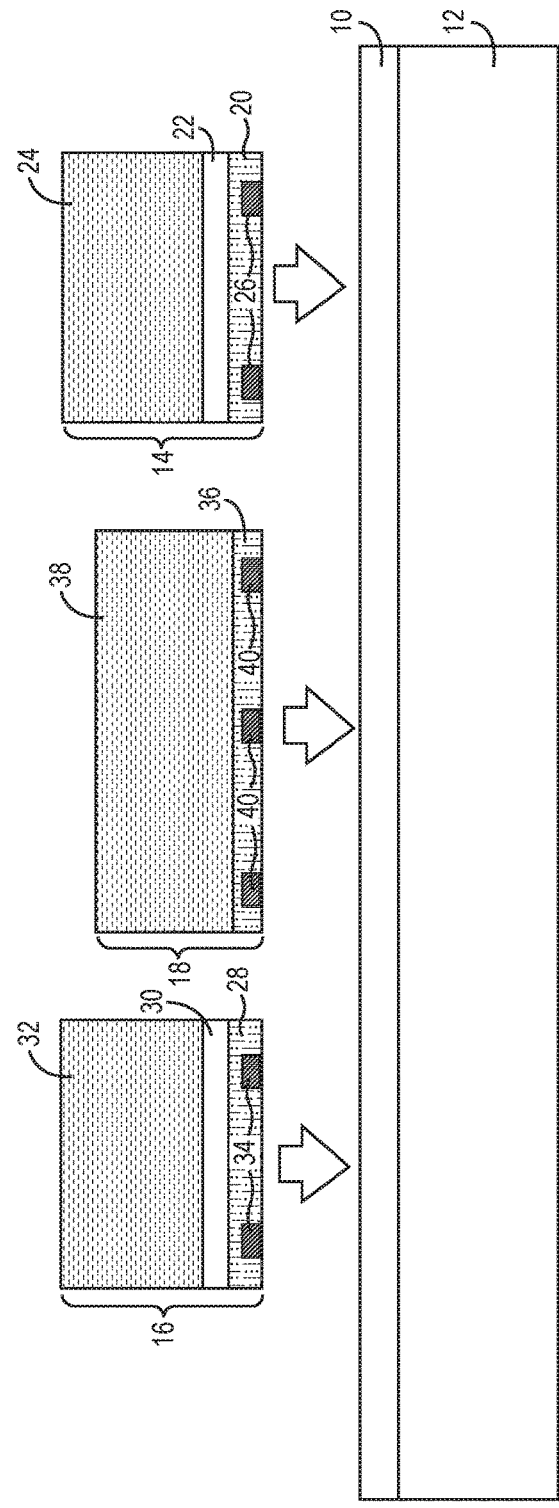

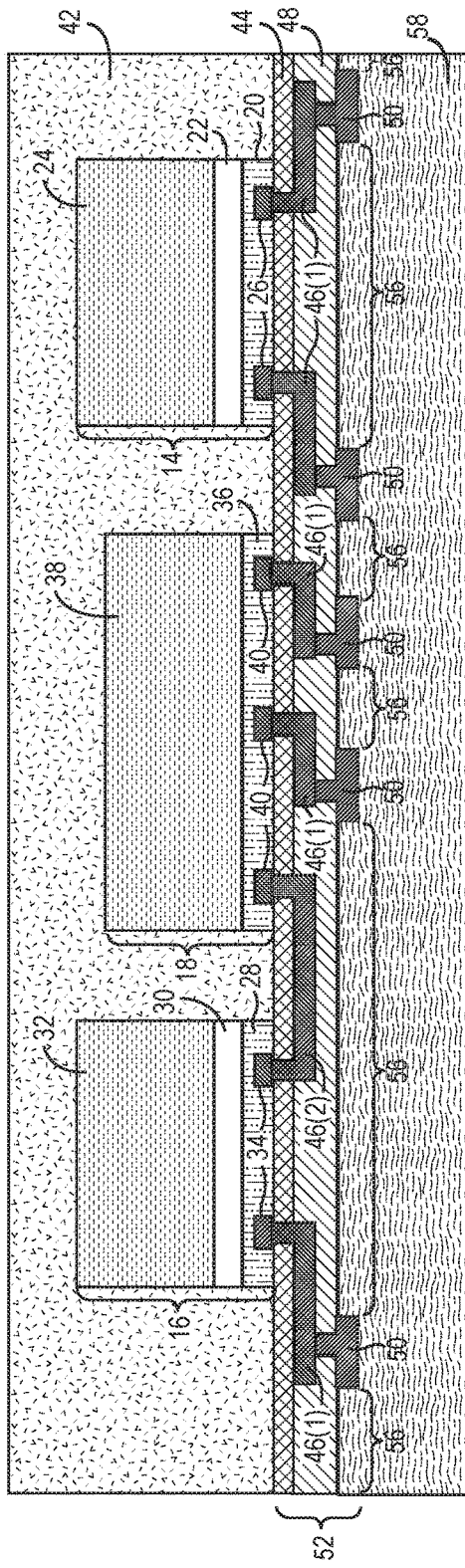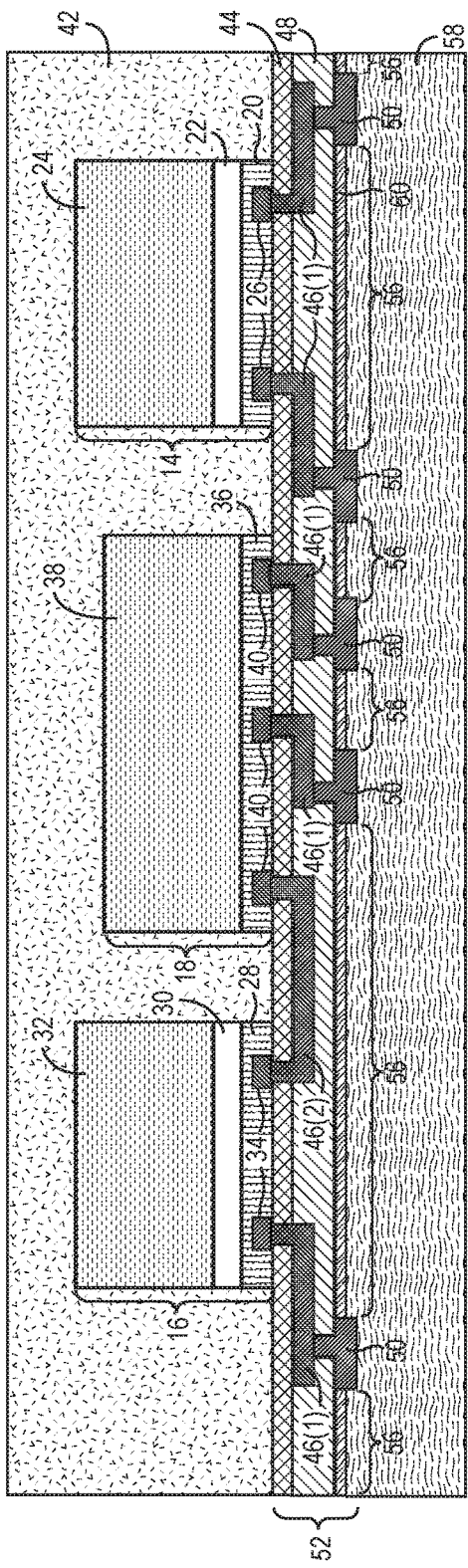

WAFER-LEVEL PACKAGE WITH ENHANCED PERFORMANCE

RELATED APPLICATIONS

This application is a continuation of U.S. patent application Ser. No. 15/676,621, filed Aug. 14, 2017, now U.S. Pat. No. 10,109,550, which claims the benefit of provisional patent application Ser. No. 62/374,318 filed Aug. 12, 2016, provisional patent application Ser. No. 62/374,332 filed Aug. 12, 2016, and provisional patent application Ser. No. 62/374,439 filed Aug. 12, 2016, the disclosures of which are hereby incorporated herein by references in their entirety.

FIELD OF THE DISCLOSURE

The present disclosure relates to a packaging process, and more particularly to a packaging process to provide a wafer-level package with enhanced thermal and electrical performance.

BACKGROUND

The wide utilization of cellular and wireless devices drives the rapid development of radio frequency (RF) technologies. The substrates on which RF devices are fabricated play an important role in achieving high level performance in the RF technologies. Fabrications of the RF devices on conventional silicon substrates may benefit from low cost of silicon materials, a large scale capacity of wafer production, well-established semiconductor design tools, and well-established semiconductor manufacturing techniques.

Despite the benefits of using conventional silicon substrates for RF device fabrication, it is well known in the industry that the conventional silicon substrates may have two undesirable properties for the RF devices: harmonic distortion and low resistivity values. Harmonic distortion is a critical impediment to achieve high level linearity in the RF devices built over silicon substrates. In addition, the low resistivity encountered in the silicon substrates may degrade quality factors (Q) at high frequencies of microelectromechanical systems (MEMS) or other passive components.

Further, high speed and high performance transistors are more densely integrated in RF devices, even as they are required to carry more power. Consequently, the amount of heat generated by the RF devices will increase significantly due to the large amount of power passing through the transistors, the large number of transistors integrated in the RF devices, and the high operation speed of the transistors. Accordingly, it is desirable to package the RF devices in a configuration for better heat dissipation.

Wafer-level fan-out (WLFO) packaging technology and embedded wafer-level ball grid array (EWLB) technology currently attract substantial attention in portable RF applications. WLFO and EWLB technologies are designed to provide high density input/output ports (I/O) as well as low profile package height without increasing the size of the component semiconductor chips. The I/O pad size on the chip remains small keeping die size to a minimum. This capability allows for densely packaging the RF devices within a single wafer.

To accommodate the increased heat generation of the RF devices, to reduce deleterious harmonic distortion of the RF devices, and to utilize advantages of WLFO/EWLB packaging technologies, it is therefore an object of the present disclosure to provide a packaging process for a wafer-level package with enhanced thermal and electrical performance.

SUMMARY

The present disclosure relates to a packaging process to provide a wafer-level package with enhanced thermal and electrical performance. According to an exemplary process, a mold wafer having a first die and a first mold compound is provided. Herein, the first die includes a first device layer, a first dielectric layer over the first device layer, and a first silicon substrate over the first dielectric layer. The first device layer includes a number of first die contacts at a bottom surface of the first device layer. A top surface of the first die is a top surface of the first silicon substrate and a bottom surface of the first die is the bottom surface of the first device layer. The first mold compound encapsulates the sides and the top surface of the first die, such that the bottom surface of the first device layer is exposed. Next, a multilayer redistribution structure is formed underneath the mold wafer. The multilayer redistribution structure includes a number of package contacts on a bottom surface of the multilayer redistribution structure and redistribution interconnects that connect the package contacts to certain ones of the first die contacts. Each package contact is separate and surrounded by a continuous air gap that extends underneath the first die. Connections between the redistribution interconnects and the first die contacts are solder-free. A dielectric layer with a planarized bottom surface is then formed to fill the continuous air gap. After the dielectric layer is formed, the first mold compound is thinned down to expose the top surface of the first silicon substrate. Next, the first silicon substrate of the first die is removed substantially to provide a first thinned die and form a cavity within the first mold compound and over the first thinned die. A top surface of the first thinned die is exposed at a bottom of the cavity. Lastly, a second mold compound is applied to substantially fill the cavity and directly contact the top surface of the first thinned die.

In one embodiment of the exemplary process, the first die provides a microelectromechanical systems (MEMS) component.

In one embodiment of the exemplary process, the first die is formed from a silicon-on-insulator (SOI) structure. The first device layer of the first die is formed from a silicon epitaxy layer of the SOI structure, the first dielectric layer of the first die is a buried oxide layer of the SOI structure, and the first silicon substrate of the first die is a silicon substrate of the SOI structure.

In one embodiment of the exemplary process, the mold wafer further includes a second intact die, which includes a second device layer and a second silicon substrate over the second device layer. Herein, a top surface of the second die is a top surface of the second silicon substrate and a bottom surface of the second die is the bottom surface of the second device layer. The first die is taller than the second die. The first mold compound encapsulates the sides and the top surface of the second die, such that the bottom surface of the second device layer is exposed.

In one embodiment of the exemplary process, the first die provides a MEMS component and the second intact die provides a complementary metal-oxide-semiconductor (CMOS) controller that controls the MEMS component.

In one embodiment of the exemplary process, the second mold compound has a thermal conductivity greater than 2 W/m·K.

In one embodiment of the exemplary process, the second mold compound has an electrical resistivity greater that 1E6 Ohm-cm.

In one embodiment of the exemplary process, the first mold compound is formed from a same material as the second mold compound.

In one embodiment of the exemplary process, the first mold compound and the second mold compound are formed from different materials.

In one embodiment of the exemplary process, the top surface of the first thinned die exposed at the bottom of the cavity is a top surface of the first dielectric layer.

In one embodiment of the exemplary process, the multi-layer redistribution structure is free of glass fiber.

According to another embodiment, the exemplary process further includes attaching the bottom surface of the dielectric layer to a rigid carrier via an adhesive material before applying the second mold compound and detaching the rigid carrier from the dielectric layer after applying the second mold compound.

In one embodiment of the exemplary process, the dielectric layer encapsulates each package contact, and the exemplary process further includes removing the dielectric layer to expose the package contacts after applying the second mold compound.

In one embodiment of the exemplary process, the dielectric layer encapsulates the sides of each package contact, and the bottom surface of the dielectric layer and a bottom surface of each package contact are in a same flat plane. The exemplary process further includes forming a bump directly over the bottom surface of each package contact after applying the second mold compound. Alternatively, the exemplary process further includes removing at least a portion of the dielectric layer after applying the second mold compound, such that at least portions of the sides of each package contacts are exposed.

In one embodiment of the exemplary process, the dielectric layer encapsulates the sides of each package contact and extends vertically beyond the bottom surface of each package contact. Herein, the dielectric layer extends underneath at least 70% of the first die. The exemplary process further includes forming a number of external contacts. Each external contact is in contact with a corresponding package contact through the dielectric layer and extends underneath the dielectric layer.

In one embodiment of the exemplary process, the mold wafer is provided by applying an adhesive layer over a carrier. Next, the first die is attached to the adhesive layer, such that the first die contacts at the bottom surface of the first device layer are covered by the adhesive layer. The first mold compound is then applied over the adhesive layer to encapsulate the first die. Lastly, the carrier and the adhesive layer are removed to expose the bottom surface of the first device layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 1-8 illustrate exemplary steps to provide a precursor package according to one embodiment of the present disclosure.

Figure 8:
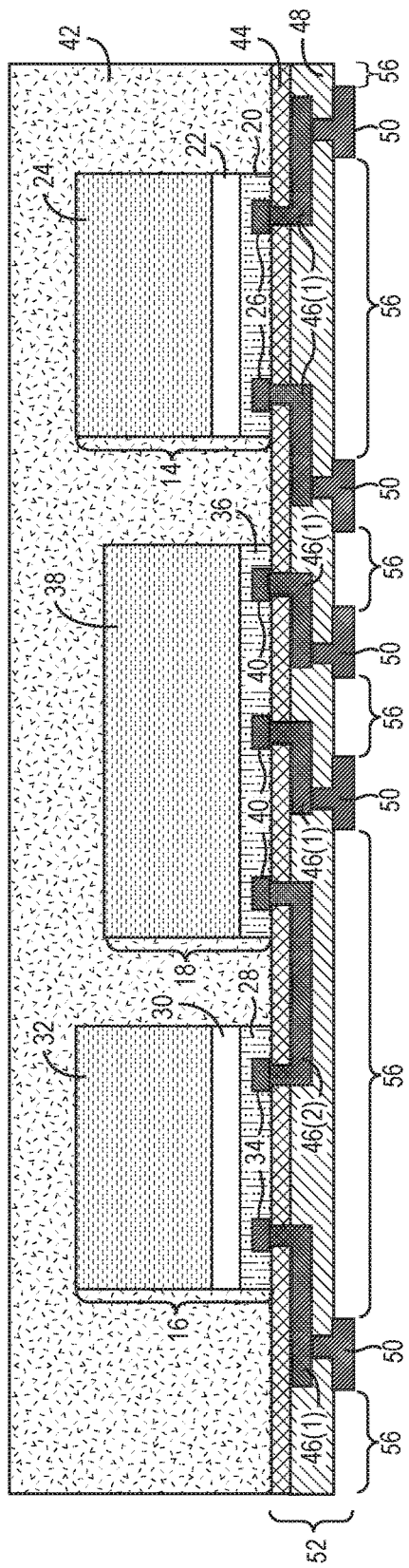
Figure 9:
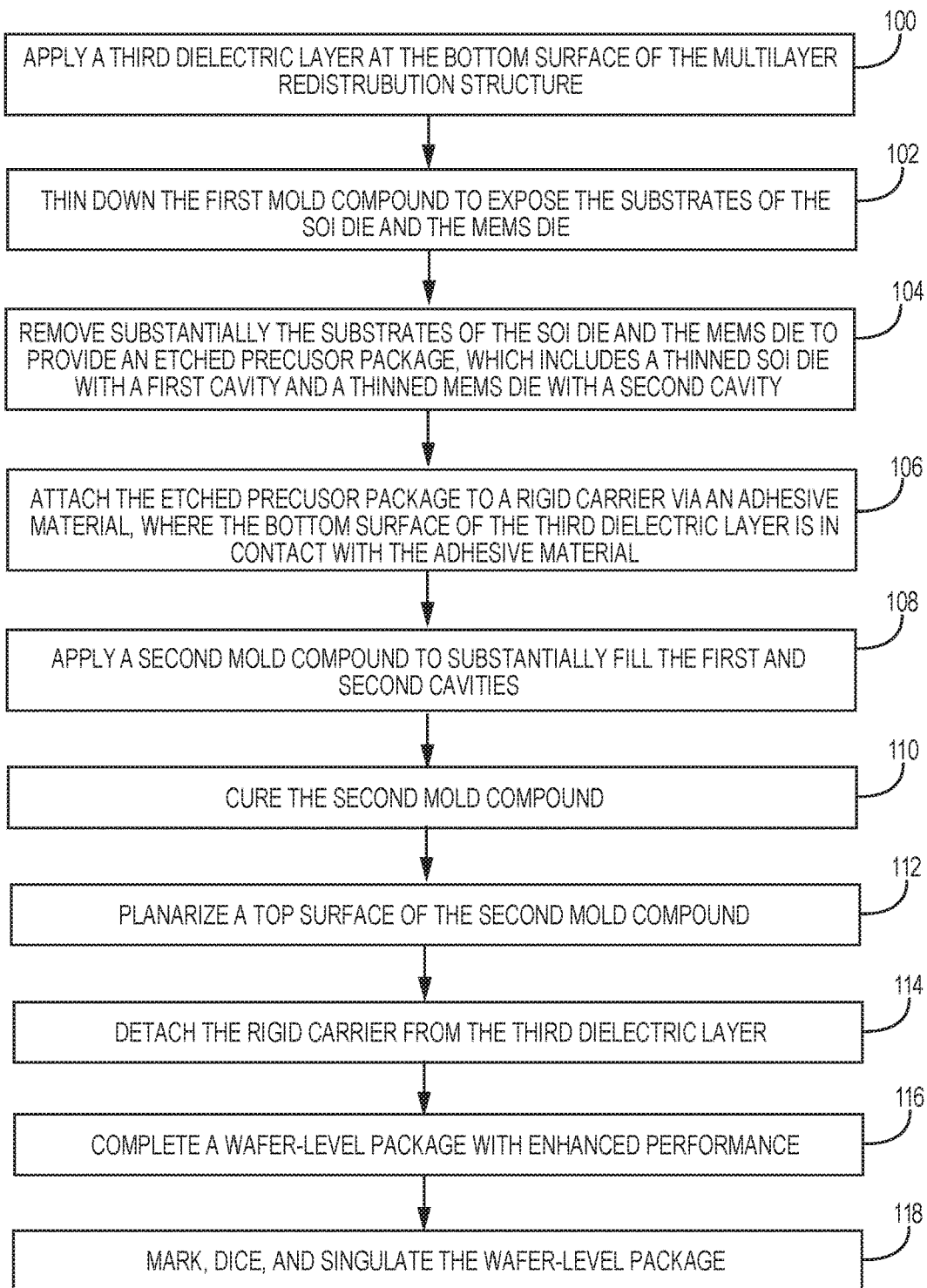

FIG. 9 provides a flow diagram that illustrates an exemplary process to provide a wafer-level package with enhanced performance from the precursor package shown in FIG. 8.

FIGS. 10A-20 illustrate the steps associated with the process of FIG. 9.

It will be understood that for clarity of illustration, FIGS. 1-20 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a packaging process to provide a wafer-level package with enhanced thermal and electrical performance. FIGS. 1-8 illustrate exemplary steps to provide a precursor package according to one embodiment of the present disclosure. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 1-8.

Initially, an adhesive layer 10 is applied on a top surface of a carrier 12 as illustrated in FIG. 1. Then, an silicon-on-insulator (SOI) die 14, a microelectromechanical systems (MEMS) die 16, and a complementary metal-oxide-semiconductor (CMOS) controller die 18 are attached to the adhesive layer 10 as illustrated in FIG. 2. In different applications, there might be fewer or more dies attached to the adhesive layer 10. For instance, in some applications, there may be only the SOI die 14 attached to the adhesive layer 10; in some applications, there may be only the MEMS die 16 and the CMOS controller die 18 attached to the adhesive layer 10, and in some applications, besides the MEMS/SOI dies, there may be thinned integrated passive device dies (not shown) attached to the adhesive layer 10.

The SOI die 14 includes a first device layer 20, a first dielectric layer 22 over a top surface of the first device layer 20, and a first silicon substrate 24 over the first dielectric layer 22. As such, a bottom surface of the first device layer 20 is a bottom surface of the SOI die 14, and the backside of the first silicon substrate 24 is a top surface of the SOI die 14. The first device layer 20 includes a number of first die contacts 26 at the bottom surface of the first device layer 20. Herein, the SOI die 14 is formed from an SOI structure, which refers to a structure including a silicon substrate, a silicon epitaxy layer, and a buried oxide layer sandwiched between the silicon substrate and the silicon epitaxy layer. The first device layer 20 of the SOI die 14 is formed by integrating electronic components (not shown) in or on the silicon epitaxy layer of the SOI structure. The first dielectric layer 22 of the SOI die 14 is the buried oxide layer of the SOI structure. The first silicon substrate 24 of the SOI die 14 is the silicon substrate of the SOI structure. The first device layer 20 has a thickness between 0.1 µm and 50 µm, and the first dielectric layer 22 has a thickness between 10 nm and 2000 nm. In addition, the SOI die 14 has a thickness between 25 µm and 250 µm or between 10 µm and 750 µm, and the first silicon substrate 24 has a thickness between 25 µm and 250 µm or between 10 µm and 750 µm, respectively.

The MEMS die 16 includes a second device layer 28, a second dielectric layer 30 over a top surface of the second device layer 28, and a second silicon substrate 32 over the second dielectric layer 30. As such, a bottom surface of the second device layer 28 is a bottom surface of the MEMS die 16, and the backside of the second silicon substrate 32 is a top surface of the MEMS die 16. The second device layer 28 includes a MEMS component (not shown) that is typically a switch and a number of second die contacts 34 at the bottom surface of the second device layer 28. Via-structures (not shown) may be used to connect the MEMS component to the second die contacts 34. The second device layer 28 has a thickness between 0.5 µm and 100 µm, and may be formed from a combination of dielectric and metal layers (such as silicon oxide, silicon nitride, aluminum, titanium, copper, or the like). The second dielectric layer 30 has a thickness between 10 nm and 10000 nm, and may be formed from silicon oxide, silicon nitride, aluminum oxide, or aluminum nitride. In addition, the MEMS die 16 has a thickness between 25 µm and 300 µm or between 10 µm and 800 µm, and the second silicon substrate 32 has a thickness between 25 µm and 300 µm or between 10 µm and 800 µm, respectively.

The CMOS controller die 18 includes a third device layer 36 and a third silicon substrate 38 over the third device layer 36. A bottom surface of the third device layer 36 is a bottom surface of the CMOS controller die 18, and the backside of the third silicon substrate 38 is a top surface of CMOS controller die 18. The third device layer 36 may include a CMOS controller (not shown) that controls the MEMS component within the thinned MEMS die 14, and a number of third die contacts 40 at a bottom surface of the third device layer 36. Via-structures (not shown) may be used to connect the CMOS controller to the third die contacts 40. The third device layer 36 has a thickness between 0.1 µm and 50 µm, and may be formed from a combination of dielectric and metal layers (such as silicon oxide, silicon nitride, aluminum, titanium, copper, or the like). In addition, the CMOS controller die 18 has a thickness between 25 µm and 250 µm or between 10 µm and 750 µm, and the third silicon substrate 38 has a thickness between 25 µm and 250 µm or between 10 µm and 750 µm, respectively. In this embodiment, the CMOS controller die 18 may be shorter than the SOI die 14 and the MEMS die 16. In different applications, the CMOS controller die 18 may be the same height as the SOI die 14 or the MEMS die 16, or the CMOS controller die 18 may be taller than the SOI die 14 and the MEMS die 16.

Next, a first mold compound 42 is applied over the adhesive layer 10 to encapsulate the SOI die 14, the MEMS die 16, and the CMOS controller die 18 as illustrated in FIG. 3. The first mold compound 42 may be an organic epoxy resin system or the like, which can be used as an etchant barrier to protect the SOI die 14, the MEMS die 16, and the CMOS controller die 18 against etching chemistries such as potassium hydroxide (KOH), sodium hydroxide (NaOH), and acetylcholine (ACH). The first mold compound 42 may be applied by various procedures, such as sheet molding, overmolding, compression molding, transfer molding, dam fill encapsulation, or screen print encapsulation. In a typical compression molding, a molding pressure used for applying the first mold compound 42 is between 100 psi and 1000 psi. Since the SOI die 14, the MEMS die 16, and the CMOS controller die 18 are relatively thick and the bottom surfaces of the SOI die 14, the MEMS die 16, and the CMOS controller die 18 are essentially flat, there may be no vertical deformations occurring to the SOI die 14, the MEMS die 16, or the CMOS controller die 18 during this molding step.

Figure 4:
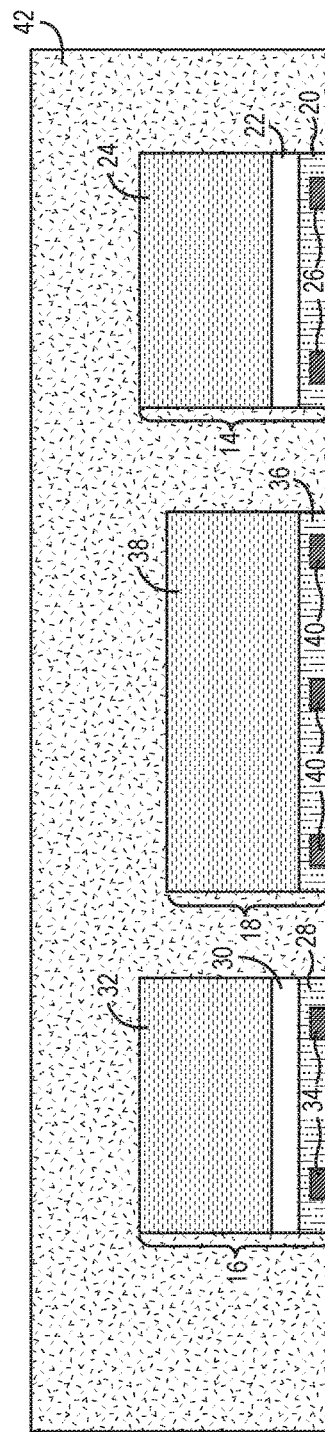

A curing process (not shown) is then used to harden the first mold compound 42. The curing temperature is between 100° C. and 320° C. depending on which material is used as the first mold compound 42. The adhesive layer 10 and the carrier 12 are then removed to expose the bottom surface of the first device layer 20, the bottom surface of the second device layer 28, and the bottom surface of the third device layer 36 as shown in FIG. 4. Removal of the adhesive layer 10 and the carrier 12 may be provided by heating the adhesive layer 10 or exposing it to ultraviolet or laser light.

Figure 5:
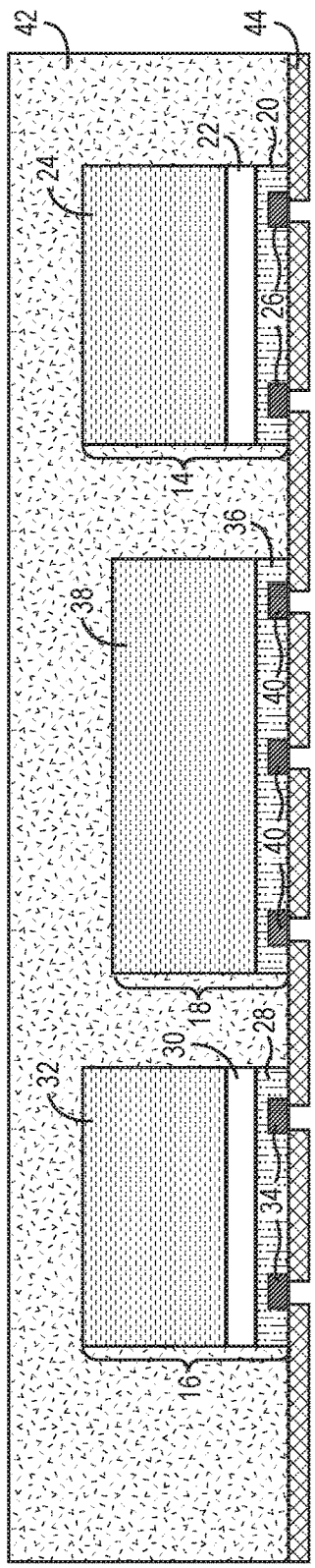

With reference to FIGS. 5 through 8, a redistribution process is provided according to one embodiment of the present disclosure. A first dielectric pattern 44 is firstly formed underneath the SOI die 14, the MEMS die 16, and the CMOS controller die 18, as illustrated in FIG. 5. As such, the first device layer 20 of the SOI die 14, the second device layer 28 of the MEMS die 16, and the third device layer 36 of the CMOS controller die 18 are in contact with the first dielectric pattern 44. In addition, the first die contacts 26 at the bottom surface of the first device layer 20, the second die contacts 34 at the bottom surface of the second device layer 28, and the third die contacts 40 at the bottom surface of the third device layer 36 are exposed through the first dielectric pattern 44.

Figure 6:
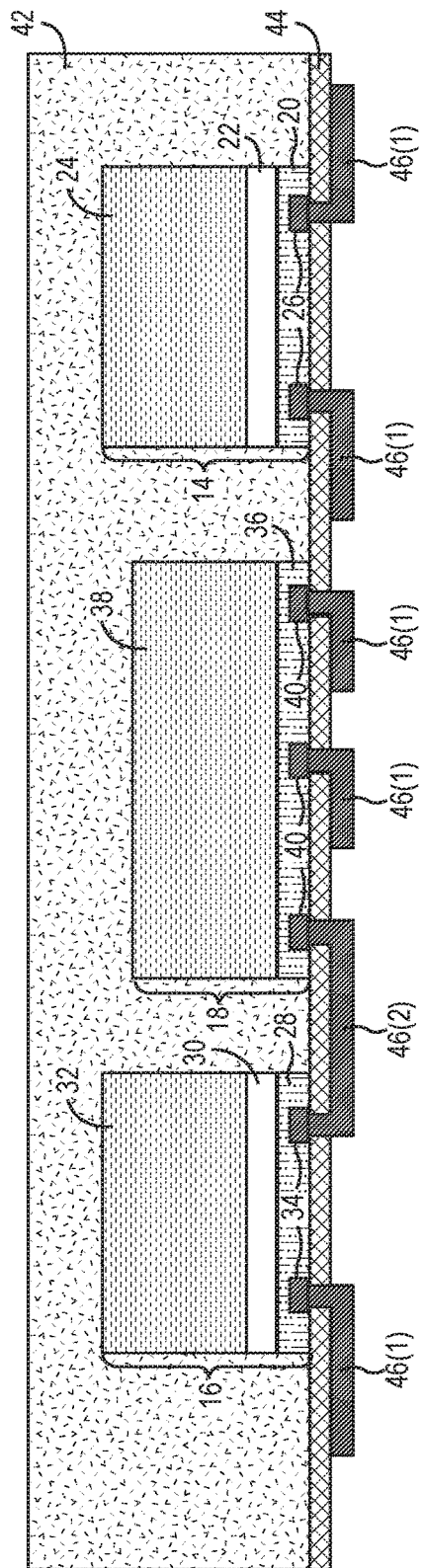

Next, a number of redistribution interconnects 46 are formed as illustrated in FIG. 6. For the purpose of this illustration, the redistribution interconnects 46 include five first redistribution interconnects 46(1) and one second redistribution interconnect 46(2). In different applications, the redistribution interconnects 46 may include fewer or more first redistribution interconnects 46(1)/second redistribution interconnects 46(2). Each first redistribution interconnect 46(1) is electrically coupled to a corresponding one of the first, second, and third die contacts 26, 34, and 40 through the first dielectric pattern 44 and extend underneath the first dielectric pattern 44. The second redistribution interconnect 46(2) is used to connect one second die contact 34 to a corresponding third die contact 40, such that the CMOS controller within the CMOS controller die 18 electrically connects the MEMS component within the thinned MEMS die 16. The second redistribution interconnect 46(2) may also extend underneath the first dielectric pattern 44. The connections between the redistribution interconnects 46 and the first, second, and third die contacts 26, 34, and 40 are solder-free.

Figure 7:
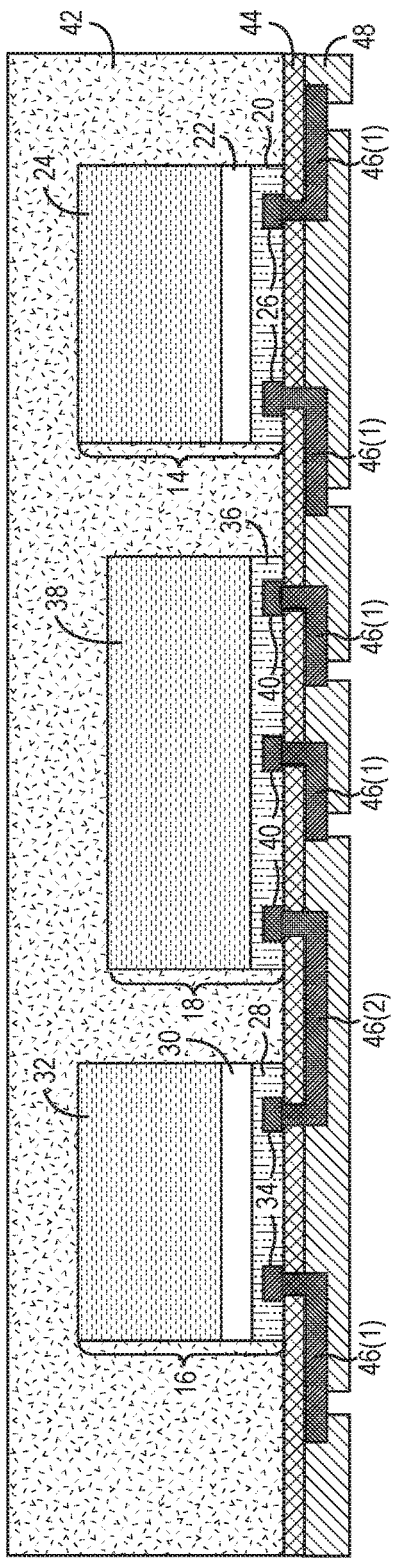

A second dielectric pattern 48 is formed underneath the first dielectric pattern 44 to partially encapsulate each first redistribution interconnect 46(1) as illustrated in FIG. 7. As such, a portion of each first redistribution interconnect 46(1) is exposed through the second dielectric pattern 48. Further, the second dielectric pattern 48 fully encapsulates the second redistribution interconnect 46(2). As such, no portion of the second redistribution interconnect 46(2) is exposed through the second dielectric pattern 48. In different applications, there may be extra redistribution interconnects (not shown) electrically coupled to the redistribution interconnects 46 through the second dielectric pattern 48, and an extra dielectric pattern (not shown) formed underneath the second dielectric pattern 48 to partially encapsulate each of the extra redistribution interconnects.

Lastly, a number of package contacts 50 are formed to complete a multilayer redistribution structure 52 and provide a precursor package 54, as illustrated in FIG. 8. Each package contact 50 is on a bottom surface of the multilayer redistribution structure 52 and electrically coupled to an exposed portion of a corresponding first redistribution interconnect 46(1) through the second dielectric pattern 48. Consequently, the first redistribution interconnects 46(1) connect the package contacts 50 to certain ones of the first, second, and third die contacts 26, 34, and 40. In addition, the package contacts 50 are separate from each other and extend underneath the second dielectric pattern 48, such that a continuous air gap 56 is simultaneously formed surrounding each package contact 50. The air gap 56 may extend underneath the SOI die 14 and/or underneath the MEMS die 16.

The multilayer redistribution structure 52 may be free of glass fiber or glass-free. Herein, the glass fiber refers to individual glass strands twisted to become a larger grouping. These glass strands may then be woven into a fabric. The first dielectric pattern 44 and the second dielectric pattern 48 may be formed of benzocyclobutene (BCB), polyimide, or other dielectric materials. The redistribution interconnects 46 may be formed of copper or other suitable metals. The package contacts 50 may be formed of at least one of copper, gold, nickel, and palladium. The multilayer redistribution structure 52 has a thickness between 2 μm and 300 μm.

FIG. 9 provides a flow diagram that illustrates an exemplary process to provide a wafer-level package with enhanced performance from the precursor package 54 shown in FIG. 8. FIGS. 10A-20 illustrate the steps associated with the process of FIG. 9. Although the flow diagram and the associated steps are illustrated in a series, they are not necessarily order dependent. Some steps may be done in a different order than that presented. Further, processes within the scope of this disclosure may include fewer or more steps than those illustrated in FIG. 9.

Figure 10C:
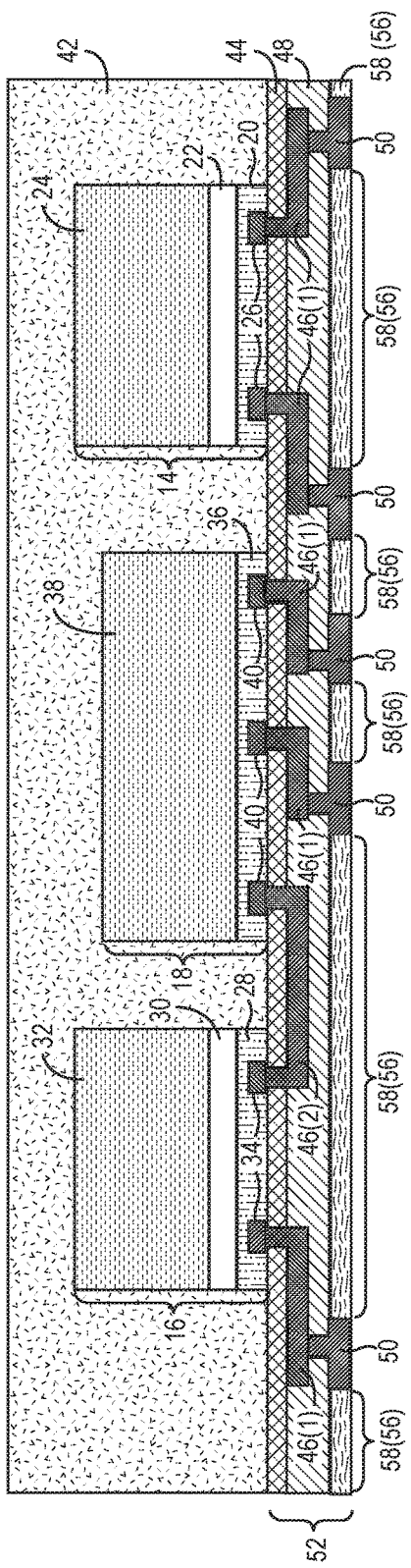

Firstly, a third dielectric layer 58 is formed at the bottom surface of the multilayer redistribution structure 52, as illustrated in FIGS. 10A-10D (step 100). In some applications, the third dielectric layer 58 may not remain in a final wafer-level package. As such, the package contacts 50 do not need to be exposed through the third dielectric layer 58, as shown in FIG. 10A. The third dielectric layer 58 fully fills the air gap 56, which is surrounding each package contact 50, encapsulates each package contact 50, and provides an essentially planarized bottom surface. The third dielectric layer 58 may be formed by spinning on, laminating, depositing or molding dielectrics to encapsulate each package contact 50, and may then be followed by polishing to realize an essentially planarized surface.

To facilitate easy removal of the third dielectric layer 58 in a later processing step (more details in the following discussion), a passivation layer 60 may be formed between the multilayer redistribution structure 52 and the third dielectric layer 58, as illustrated in FIG. 10B. The passivation layer 60 covers at least exposed bottom surface portions of the second dielectric pattern 48 to protect the first and second dielectric patterns 44 and 48 during the later removal of the third dielectric layer 58. In one embodiment, the passivation layer 60 may be formed before applying the third dielectric layer 58 by depositing silicon nitride, aluminum nitride, or other metal or dielectric film, which etches differently than the third dielectric layer 58, to the exposed bottom surface portions of the second dielectric pattern 48 within the air gap 56. The passivation layer 60 is not vertically beyond the package contacts 50 and has a thickness between 5 nm and 5000 nm. In another embodiment, the passivation layer 60 may be a seed layer for the package contacts 50, which is formed before the package contacts 50 and may be formed of a same or different material as the package contacts 50 (although more than 10 times thinner than a thickness of the package contacts 50 protruding from the bottom surface of the second dielectric pattern 48). Herein, the passivation layer 60 may extend over the entire bottom surface of the second dielectric pattern 48 and may be sandwiched between the second dielectric pattern 48 and the package contacts 50 (not shown).

In some applications, at least a portion of the third dielectric layer 58 may remain in a final wafer-level package. As such, each package contact 50 needs to be exposed through the third dielectric layer 58. Herein, the third dielectric layer 58 fully fills the air gap 56 and encapsulates the sides of each package contact 50 as shown in 10C. A bottom surface of the third dielectric layer 58 and a bottom surface of each package contact 50 are in a same flat plane. The third dielectric layer 58 may be formed by spinning on, laminating, depositing, or molding dielectrics to encapsulate each package contact 50 and is then followed by a thinning step (such as chemical-mechanical planarization or etching technique) to expose the bottom surface of each package contact 50.

In addition, when the air gap 56 extends underneath at least 70% of the SOI die 14 and/or extends underneath at least 70% of the MEMS die 16, the third dielectric layer 58 may encapsulate the sides of each package contact 50, fully fill the air gap 56, and extend vertically beyond the bottom surface of each package contact 50 as shown in 10D. Since the third dielectric layer 58 may extend vertically beyond the bottom surface of each package contact 50, a number of separate air openings 62 are simultaneously formed vertically below each package contact 50. Each package contact 50 may have a same or different size, and may have a same or different shape, such as square, rectangular, triangular, and round. Consequently, each air opening 62 may have a same or different size, and may have a same or different shape, such as square, rectangular, triangle, and round. If there is no package contact 50 vertically below the SOI die 14 and the MEMS die 16, there will be no air opening 62 vertically below the SOI die 14 and the MEMS die 16. Each air opening 62 has a size between 25 µm×25 µm and 400 µm×400 µm, and is much smaller compared to the air gap 56. The depth of each air opening 62 is minimized to as close to zero as possible. Herein, the third dielectric layer 58 has an essentially planarized bottom surface and each package contact 50 is exposed through the third dielectric layer 58. The third dielectric layer 58 may be formed by spinning on, laminating, depositing, or molding dielectrics, and may then be followed by polishing to realize an essentially planarized surface. For FIGS. 10A-10D, the third dielectric layer 58 may be formed of BCB, polyimide, or other dielectric materials (like UV sensitive material). The third dielectric layer 58 may be formed of a same or different material as the second dielectric pattern 48.

Figure 10D:
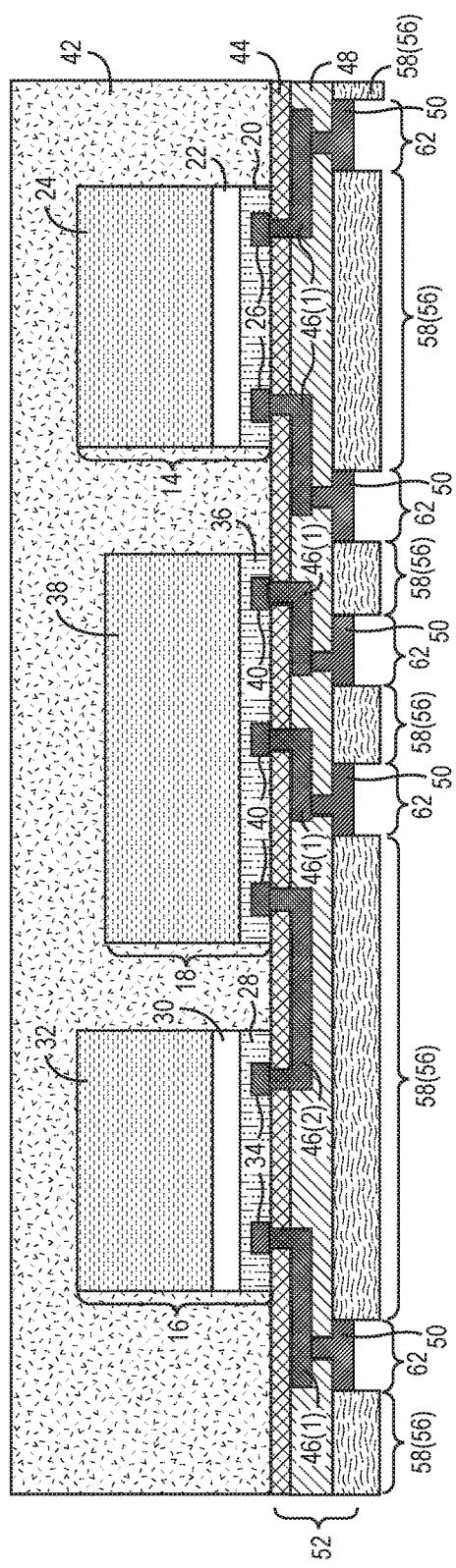
Figure 11:
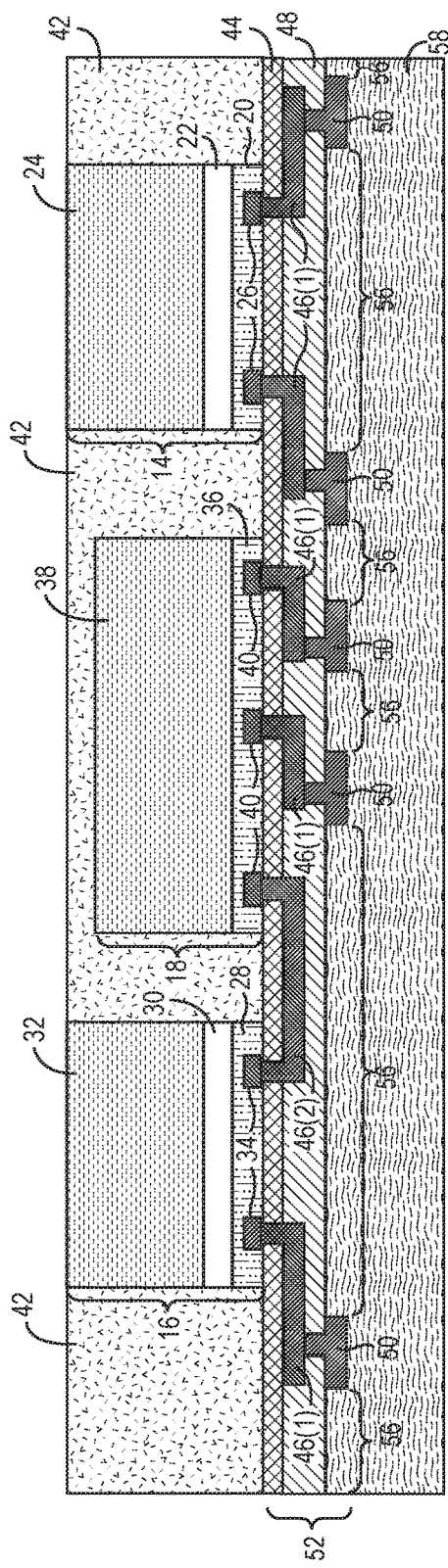

After the third dielectric layer 58 is formed, the first mold compound 42 is thinned down to expose the first silicon substrate 24 of the SOI die 14 and the second silicon substrate 32 of the MEMS die 16 as shown in FIG. 11 (step 102). Herein, FIG. 11 is derived from FIG. 10A, a same thinning procedure may also be applied to FIGS. 10B-10D (not shown for simplicity). The thinning procedure may be done with a mechanical grinding process. Herein, the CMOS controller die 18 has a lower height than both the MEMS die 16 and the SOI die 14, such that the silicon substrate 38 of the CMOS controller die 18 is not exposed and still encapsulated by the first mold compound 42.

Figure 12:
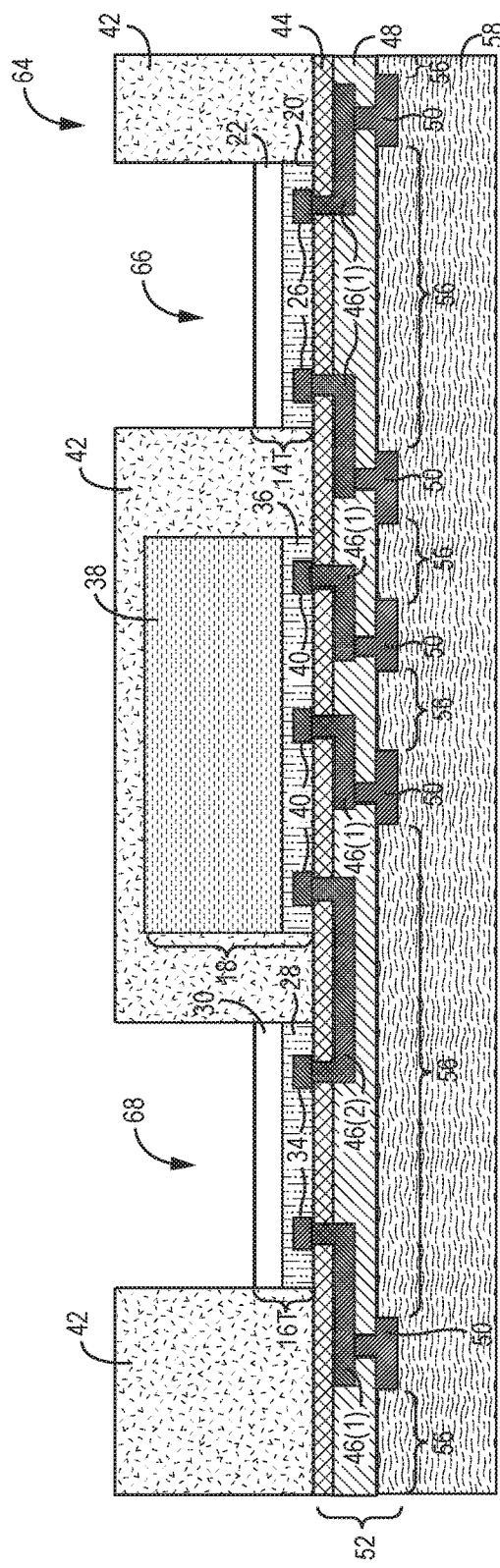

Next, the first silicon substrate 24 and the second silicon substrate 32 are removed substantially to provide an etched precursor package 64, as illustrated in FIG. 12 (step 104). The removal of the first silicon substrate 24 from the SOI die 14 provides a thinned SOI die 14T and forms a first cavity 66 within the first mold compound 42 and over the thinned SOI die 14T. The removal of the second silicon substrate 32 from the MEMS die 16 provides a thinned MEMS die 16T and forms a second cavity 68 within the first mold compound 42 and over the thinned MEMS die 16T. Herein, removing substantially a silicon substrate refers to removing at least 95% of the entire silicon substrate and remaining at most 2 µm silicon substrate. In desired cases, the first and second silicon substrates 24 and 32 are removed completely, such that the first dielectric layer 22 of the thinned SOI die 14T is exposed at the bottom of the first cavity 66 and the second dielectric layer 30 of the thinned MEMS die 16T is exposed at the bottom of the second cavity 68.

Removing substantially the first and second silicon substrates 24 and 32 may be provided by an etching process with a wet/dry etchant chemistry, which may be TMAH, KOH, ACH, NaOH, or the like. The first dielectric layer 22 functions as an etching stop to protect the first device layer 20 of the thinned SOI die 14T, and the second dielectric layer 30 functions as an etching stop to protect the second device layer 28 of the thinned MEMS die 16T. The first mold compound 42 encapsulates and protects the CMOS controller die 18 from the wet/dry etchant chemistry. In some applications, a protection layer (not shown) may be placed at the bottom surface of the third dielectric layer 58 to protect the third dielectric layer 58 and/or the package contacts 50 (if the package contacts 50 are exposed through the third dielectric layer 58, as shown in FIGS. 10C and 10D) from the etchant chemistry. The protection layer is applied before the etching process and removed after the etching process. Further, if the silicon substrate 38 of the CMOS controller die 18 is not encapsulated by the first mold compound 42 (in some applications, if the CMOS controller die 18 has a same height as or is taller than the SOI die 14 and the MEMS die 16, the silicon substrate 38 of the CMOS controller die 18 will be exposed during the thinning process), there may be an extra protection layer (not shown) placed over the silicon substrate 38 to protect the CMOS controller die 18 from the wet/dry etchant chemistry. The extra protection layer is applied before the etching process and removed after the etching process.

Figure 13:
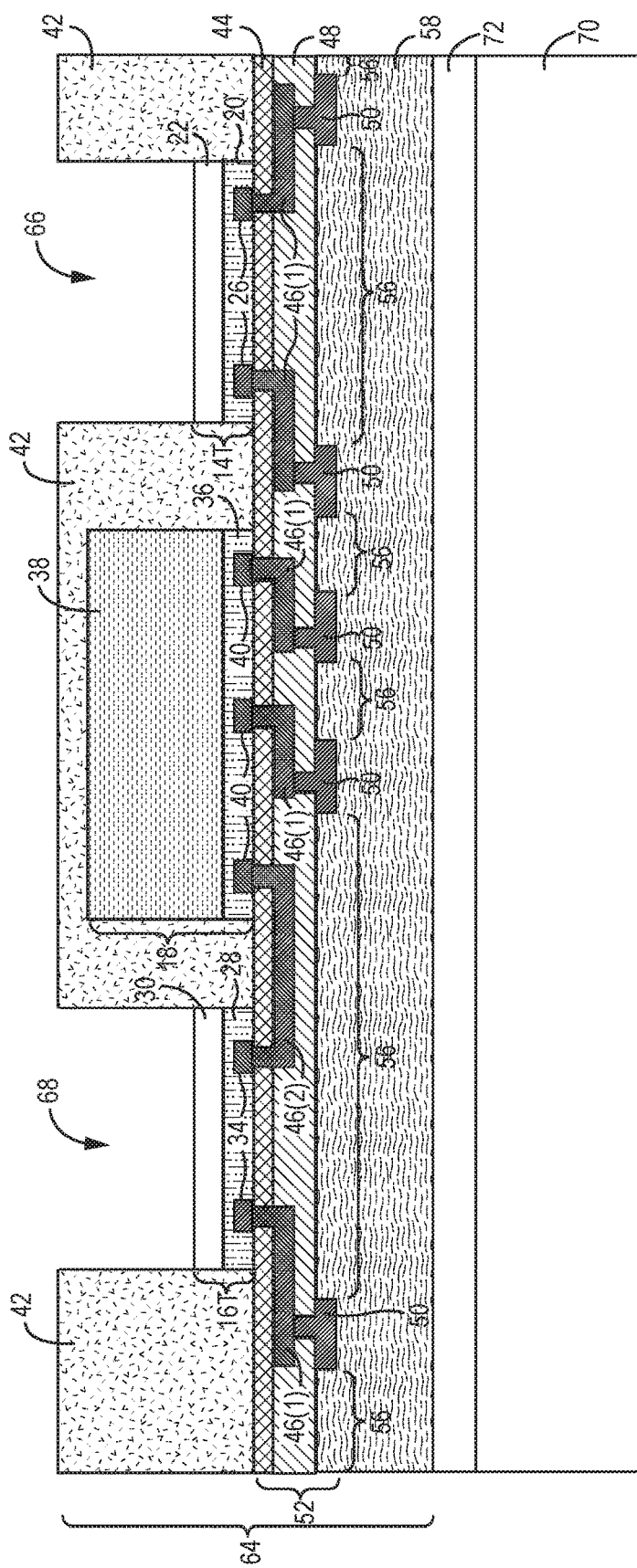

The etched precursor package 64 may be attached to a rigid carrier 70 via an adhesive material 72, as illustrated in FIG. 13 (step 106). The rigid carrier 70 may be phototransmissive and formed from quartz, fused silica, or sapphire. The adhesive material 72 may be a UV sensitive adhesive tape or film. If the third dielectric layer 58 encapsulates the package contacts 50 or extends vertically beyond the bottom surface of each package contact 50 (as shown in FIGS. 10A, 10B, and 10D), the planarized bottom surface of the third dielectric layer 58 is in contact with the adhesive material 72. If the bottom surface of the third dielectric layer 58 and the bottom surface of each package contact 50 are in a same flat plane (as shown in FIG. 10C), both the third dielectric layer 58 and the package contacts 50 are in contact with the adhesive material 72 (not shown). The rigid carrier 70 may help assist with mechanical support of the etched precursor package 64. In some applications, the etched precursor package 64 may not be attached to the rigid carrier 70, and the rigid carrier 70 is not used in the following fabrication steps.

Figure 14:
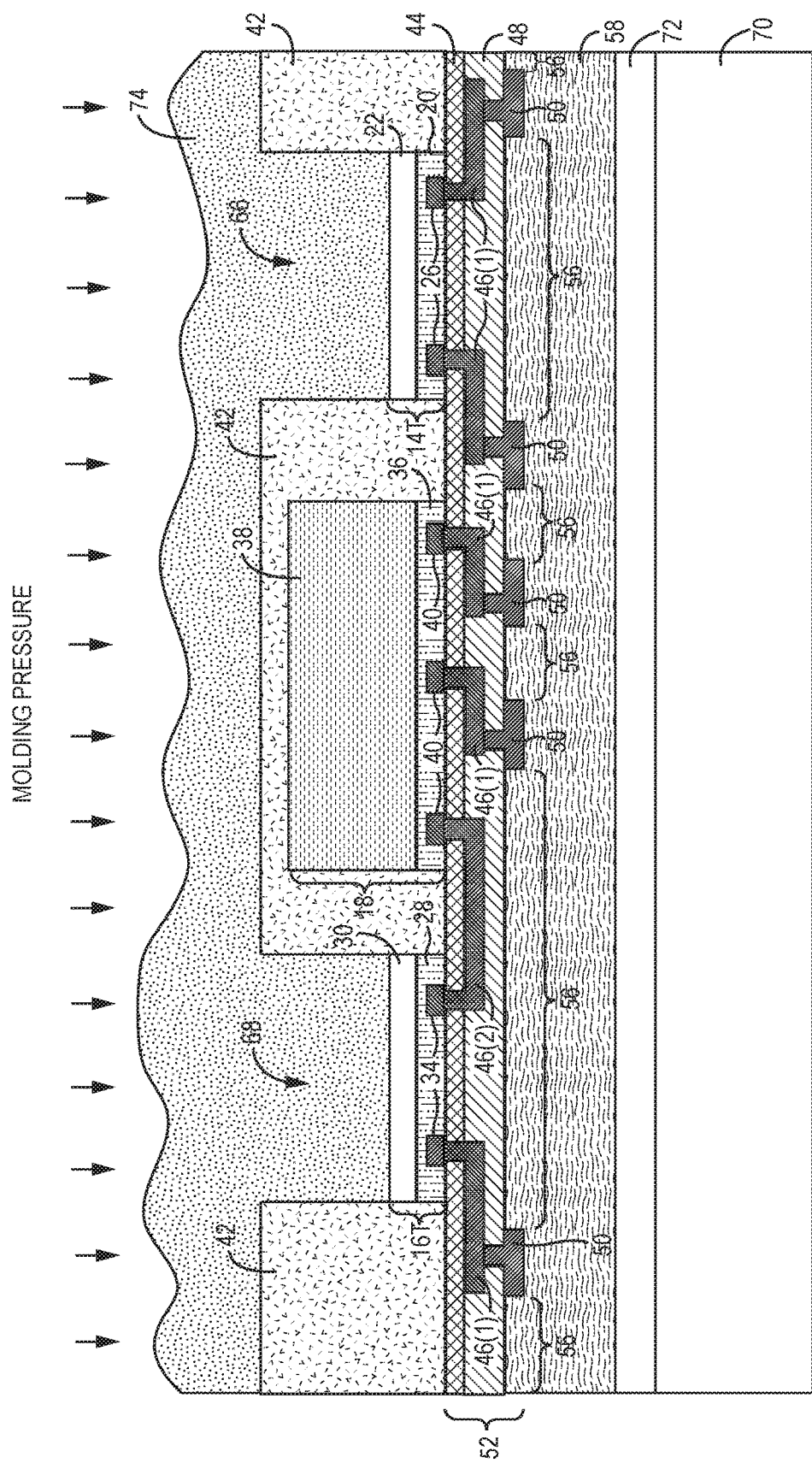

A second mold compound 74 is then applied to substantially fill the first and second cavities 66 and 68, as illustrated in FIG. 14 (step 108). Herein, substantially filling a cavity refers to filling at least 75% of the entire cavity. The second mold compound 74 directly resides over the top surface of the thinned SOI die 14T and the top surface of the thinned MEMS die 16T. If there is no first silicon substrate 24 left in the first cavity 66 and no second silicon substrate 32 left in the second cavity 68, the second mold compound 74 directly resides over the first dielectric layer 22 and the second dielectric layer 30. In some cases, a portion of the second mold compound 74 may further reside over the first mold compound 42. The second mold compound 74 is separated from the CMOS controller die 18 by the first mold compound 42. A top surface of the CMOS controller die 18 is in contact with the first mold compound 42.

The second mold compound 74 has a thermal conductivity greater than 2 W/m·K or greater than 10 W/m·K, and has an electrical resistivity greater than 1E6 Ohm-cm. In general, the higher the thermal conductivity of the second mold compound 74, the better the thermal performance of the thinned SOI die 14T and the thinned MEMS die 16T. Further, the high electrical resistivity of the second mold compound 74 may improve the quality factor (Q) at high frequencies of the MEMS component of the thinned MEMS die 16T, and may reduce loss in the thinned SOI die 14T.

The second mold compound 74 may be formed of thermoplastics or thermoset materials, such as PPS (poly phenyl sulfide), overmold epoxies doped with boron nitride or alumina thermal additives, or the like. In some applications, the etched precursor package 64 may only include the MEMS die 16 and the CMOS controller die 18. The second mold compound 74 may also be formed from an organic epoxy resin system with a thermal conductivity less than 2 W/m·K. The second mold compound 74 may be formed of a same or different material as the first mold compound 42. However, unlike the second mold compound 74, the first mold compound 42 does not have thermal conductivity or electrical resistivity requirements. In some applications, both the first mold compound 42 and the second mold compound 74 have a thermal conductivity greater than 2 W/m·K. In some applications, the first mold compound 42 has a thermal conductivity less than 2 W/m·K and the second mold compound 74 has a thermal conductivity greater than 2 W/m·K. In some applications, the first mold compound 42 has a thermal conductivity greater than 2 W/m·K and the second mold compound 74 has a thermal conductivity greater than 10 W/m·K.

The second mold compound 74 may be applied by various procedures, such as sheet molding, overmolding, compression molding, transfer molding, dam fill encapsulation, and screen print encapsulation. During the molding process of the second mold compound 74, liquefaction and molding pressure may be not uniform across the entire etched precursor package 64. A first combination of the thinned SOI die 14T and a first portion of the multilayer redistribution structure 52 directly underneath the thinned glass-based die 14T, and a second combination of the thinned MEMS die 16T and a second portion of the multilayer redistribution structure 52 directly underneath the thinned MEMS die 16T may suffer more molding pressure than the other portions of the etched precursor package 64. In a typical compression molding, if the second mold compound 74 is formed of high thermal conductivity materials (>=2 W/m·K), a molding pressure and a temperature used for applying the second mold compound 74 is between 250 psi and 1000 psi, and between 100° C. and 350° C., respectively.

Notice that the thinned SOI die 14T has a thickness between 0.1 μm and 50 μm, the thinned MEMS die 16T has a thickness 0.5 μm and 100 μm, and the multilayer redistribution structure 52 has a thickness between 2 μm and 300 μm. As such, the first combination of the thinned SOI die 14T and the first portion of the multilayer redistribution structure 52, or the second combination of the thinned MEMS die 16T and the second portion of the multilayer redistribution structure 52 may have a thickness as thin as a few μm. If there is no third dielectric layer 58 filling the air gap 56, especially portions of the air gap 56 that are vertically below the thinned SOI die 14T and/or vertically below the thinned MEMS die 16T, vertical deformations of the first combination and/or vertical deformations of the second combination may occur during a molding step. Without extra support in the portions of the air gap 56 that are vertically below the thinned SOI die 14T and/or vertically below the thinned MEMS die 16T, the first combination and the second combination may not endure high vertical molding pressure.

In one embodiment, when the third dielectric layer 58 fully fills the air gap 56, encapsulates each package contact 50, and provides the planarized bottom surface (as shown in FIGS. 10A and 10B), there is no air gap under the multilayer redistribution structure 52. As such, the third dielectric layer 58 combined with the rigid carrier 70 may provide enough mechanical support to the thinned SOI die 14T and the thinned MEMS die 16T for enduring high molding pressures. The vertical deformations of the thinned SOI die 14T and the thinned MEMS die 16T may be reduced to an acceptable level.

In another embodiment, when the third dielectric layer 58 fully fills the air gap 56, encapsulates the sides of each package contact 50, and has the bottom surface in a same flat plane as the bottom surface of each package contact 50 (as shown in FIGS. 10C), there is no air gap under the multilayer redistribution structure 52. As such, the third dielectric layer 58 combined with the rigid carrier 70 (not shown) may provide enough mechanical support to the thinned SOI die 14T and the thinned MEMS die 16T for enduring high molding pressures. The vertical deformations of the thinned SOI die 14T and the thinned MEMS die 16T may be reduced to an acceptable level.

In addition, when the third dielectric layer 58 fully fills the air gap 56, encapsulates the sides of each package contact 50, and extends vertically beyond the bottom surface of each package contact 50 (as shown in FIG. 10D), there are a number of air openings 62 formed vertically below each package contact 50. Since each air opening 62 is much smaller compared to the air gap 56 and may not be vertically below the thinned SOI die 14T and the thinned MEMS die 16T, the air openings 62 may lead to significantly less vertical deformation of the thinned SOI die 14T and the thinned MEMS die 16T than the unfilled air gap 56. The third dielectric layer 58 extends underneath at least 70% of the thinned SOI die 14T and/or extends underneath at least 70% of the thinned MEMS die 16T (because the air gap 56 extends underneath at least 70% of the thinned SOI die 14T and/or extends underneath at least 70% of the thinned MEMS die 16T, and the third dielectric layer 58 fully fills the air gap 56). As such, the third dielectric layer 58 combined with the rigid carrier 70 (not shown) may provide enough mechanical support to the thinned SOI die 14T and the thinned MEMS die 16T for enduring high molding pressures. Further, there may be some air openings 62 vertically below the first mold compound 42 and/or vertically below the CMOS controller die 16. Since the first mold compound 42 and the CMOS controller die 16 are relatively thick, and the air openings 62 have small sizes (no more than 400 μm×400 μm), the first mold compound 42 and/or the CMOS controller die 16 are rigid enough to ensure high molding pressures.

Figure 15:
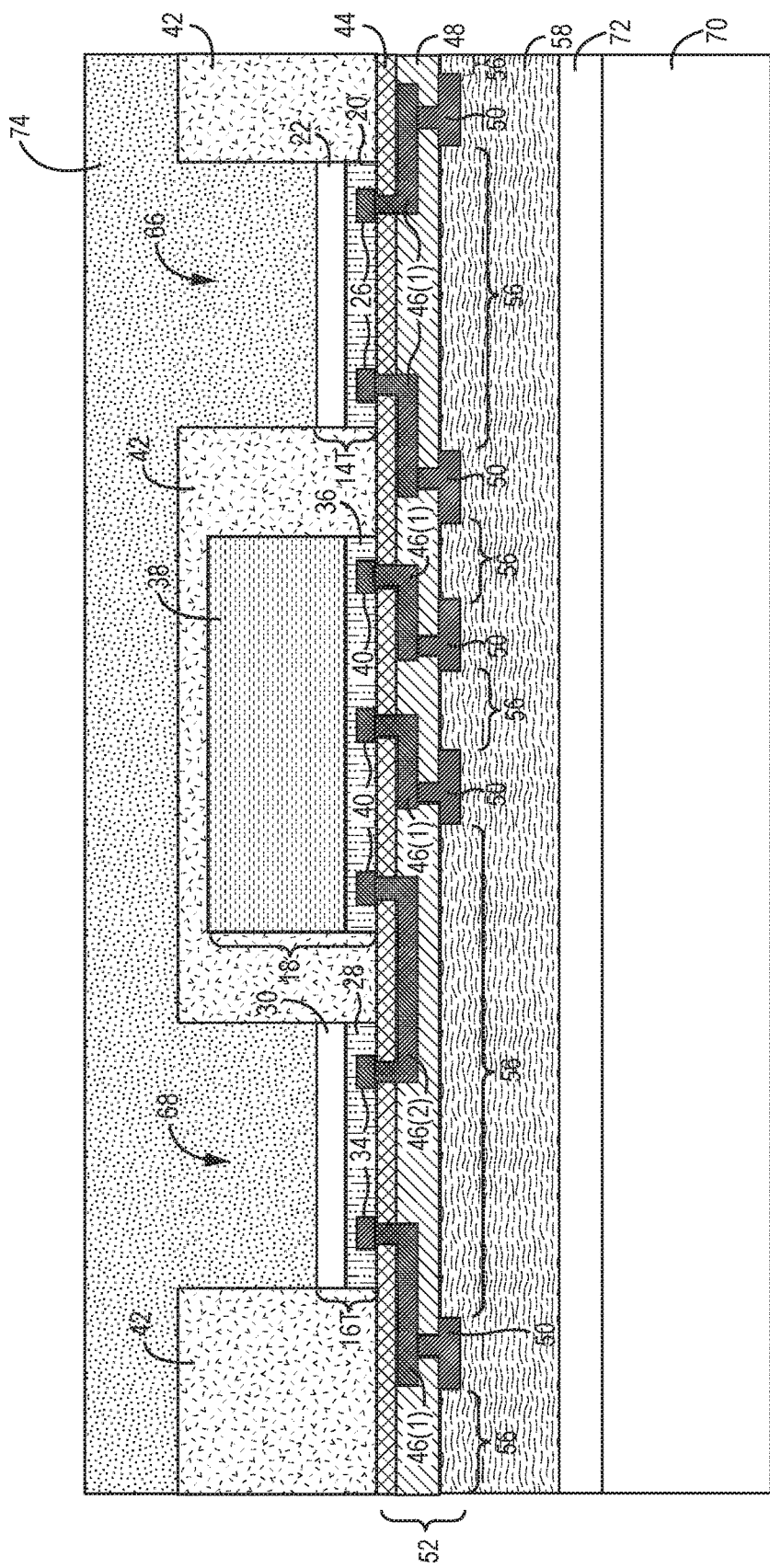

A curing process (not shown) is followed to harden the second mold compound 74 (step 110). The curing temperature is between 100° C. and 320° C. depending on which material is used as the second mold compound 74. A top surface of the second mold compound 74 is then planarized as illustrated in FIG. 15 (step 112). If the second mold compound 74 does not cover a top surface of the first mold compound 42, the top surface of the second mold compound 74 and /or the first mold compound 42 are planarized to be coplanar (not shown). A mechanical grinding process may be used for planarization.

FIGS. 16A-16D (step 114) illustrate that third dielectric layer 58 is exposed after the rigid carrier 70 is detached. FIGS. 16A-16D are derived from FIGS. 10A-10D, respectively. If the rigid carrier 70 is a photo-transmissive rigid carrier and the adhesive material 72 is a UV sensitive film or tape, the rigid carrier 70 is exposed to a UV environment to achieve the detaching process.

Figure 16A:
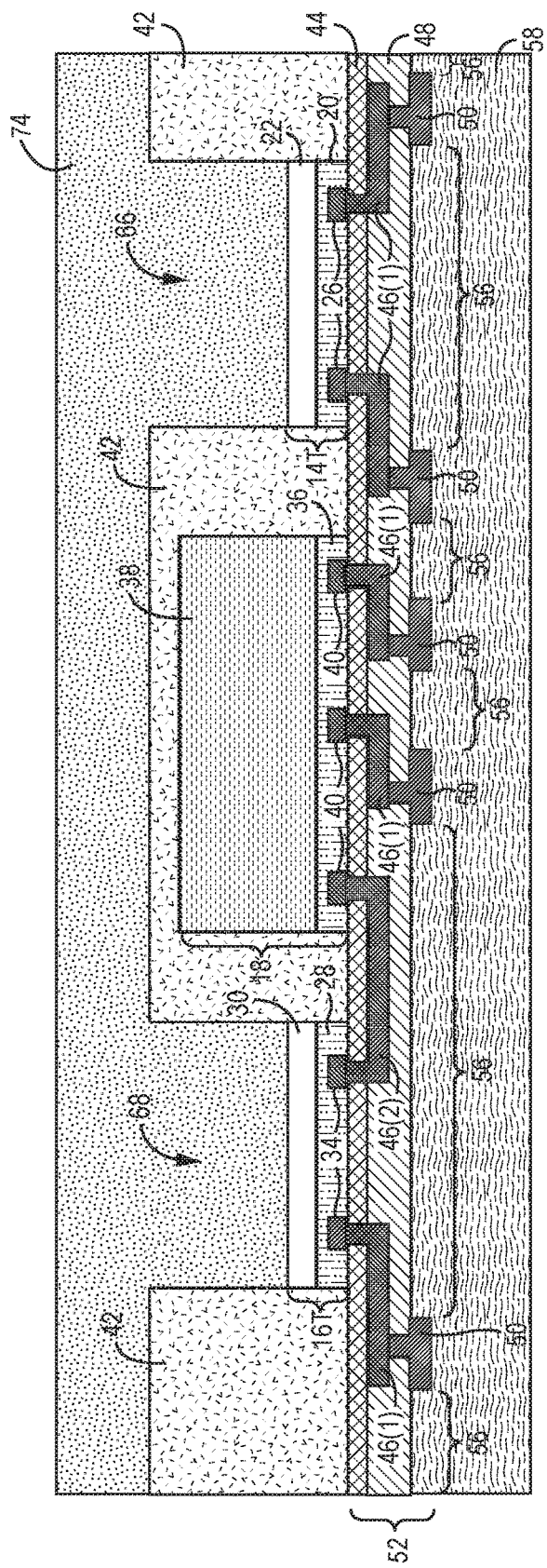
Figure 16B:
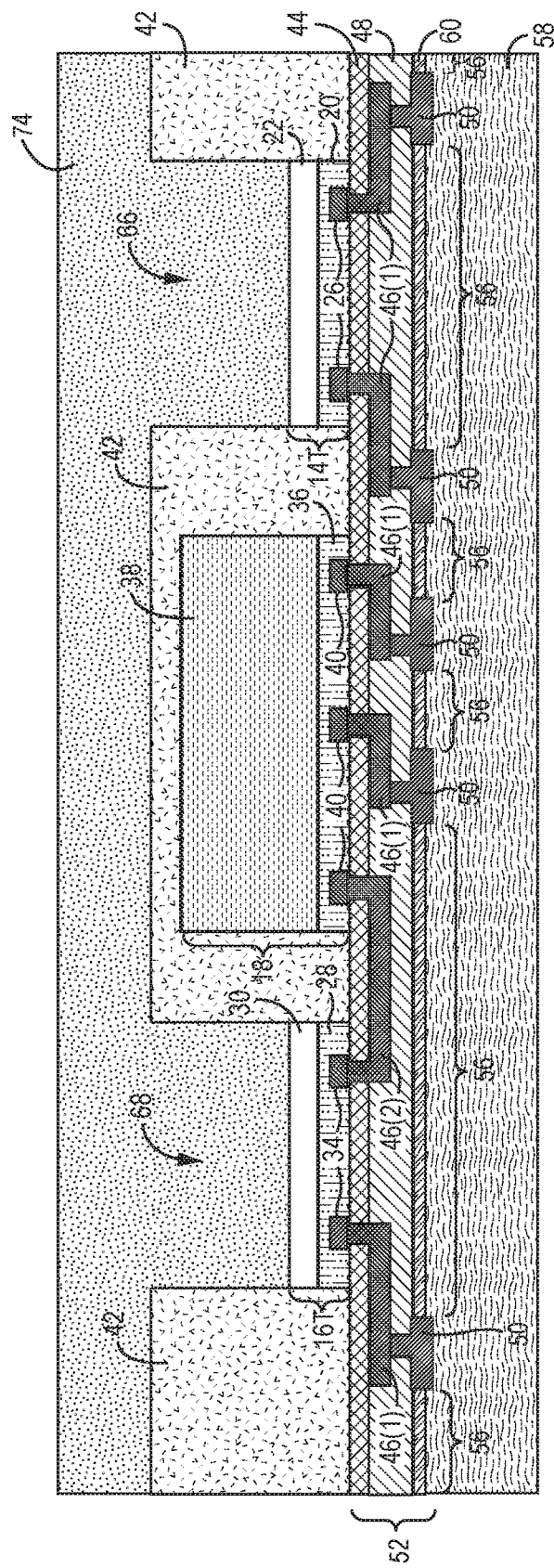
Figure 17:
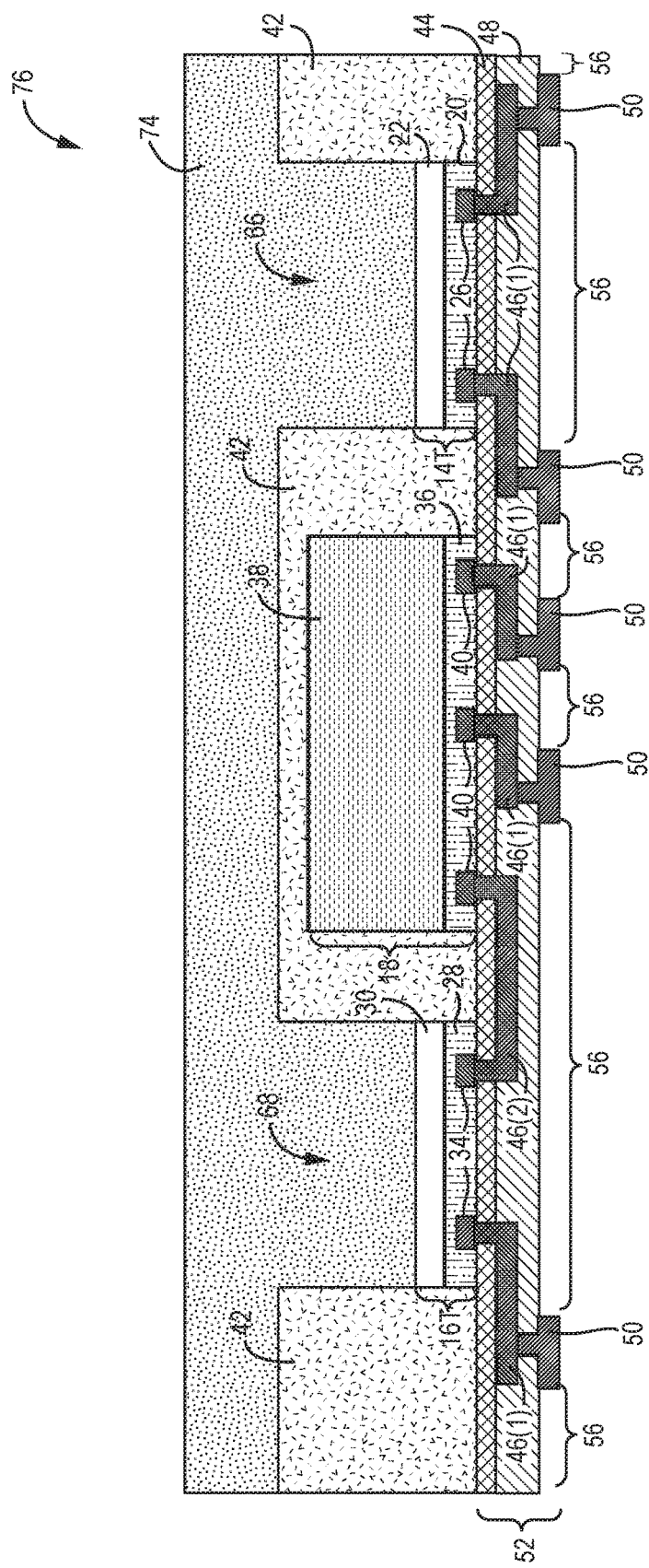

After the detaching process, the package contacts 50 may be fully encapsulated by the third dielectric layer 58 (shown in FIGS. 16A and 16B). In order to complete a wafer-level package 76 with enhanced performance, the third layer 58 and the passivation layer 60 (if exists) are removed as illustrated in FIG. 17 (step 116). Wet etching may be used to remove the third dielectric layer 58 from the multilayer redistribution structure 52. If there is no passivation layer between the third dielectric layer 58 and the second dielectric pattern 48, the third dielectric layer 58 and the second dielectric pattern 48 may be formed of different materials with different etching properties. For instance, the third dielectric layer 58 and the second dielectric pattern 48 are formed of two different polyimide materials with different etching properties. As such, selectively etching the third dielectric layer 58 without attacking the second dielectric pattern 48 may be achieved. If the passivation layer 60 is sandwiched between the third dielectric layer 58 and the second dielectric pattern 48, the third dielectric layer 58 and the second dielectric pattern 48 may be formed of materials with a same or different etching property. The passivation layer 60 is an etching stop to protect the second dielectric pattern 48. Wet or dry etching may be used to remove the passivation layer 60. Since the passivation layer 60 and the second dielectric pattern 48 are formed of different materials with different etching properties, selectively etching the passivation layer 60 without attacking the second dielectric pattern 48 may be achieved. In addition, to protect the package contacts 50 while etching the passivation layer 60, a lithography technique may be used. If the passivation layer 60 is the seed layer for the package contacts 50, the passivation layer 60 may be etched without the lithography technique. The package contacts 50 may be attacked but not significantly changed due to the large thickness difference (more than 10 times) between the passivation layer 60 and a portion of each package contact 50 that protrudes from the bottom surface of the second dielectric pattern 48.

Figure 16C:
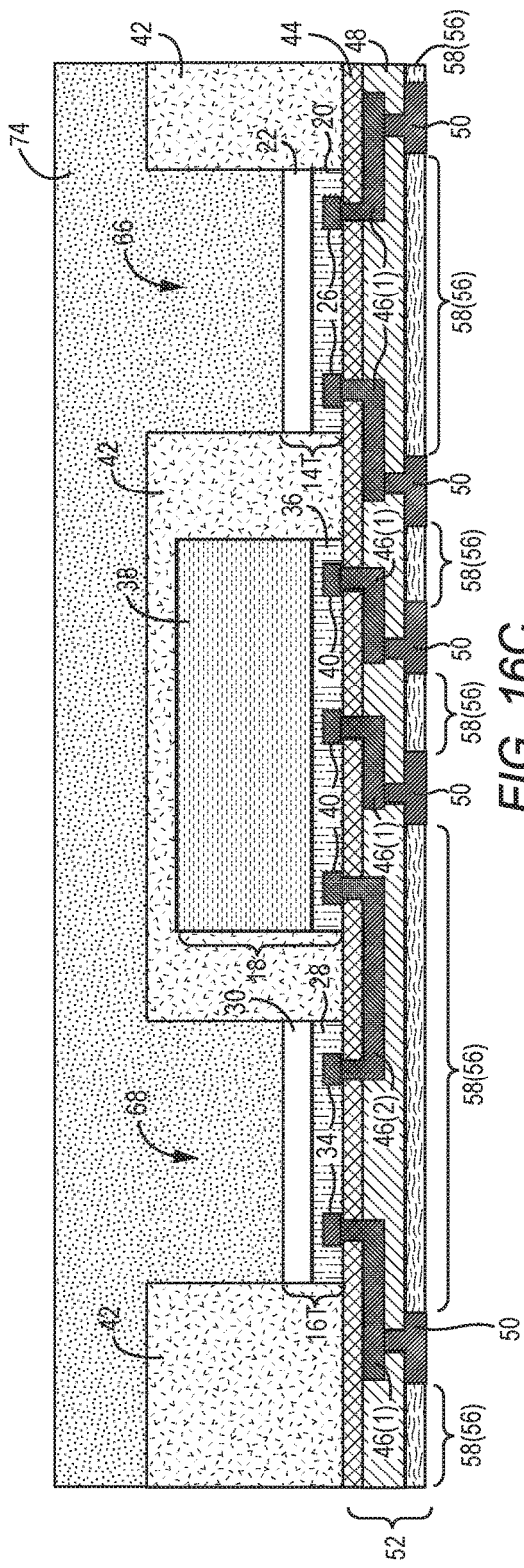
Figure 18:
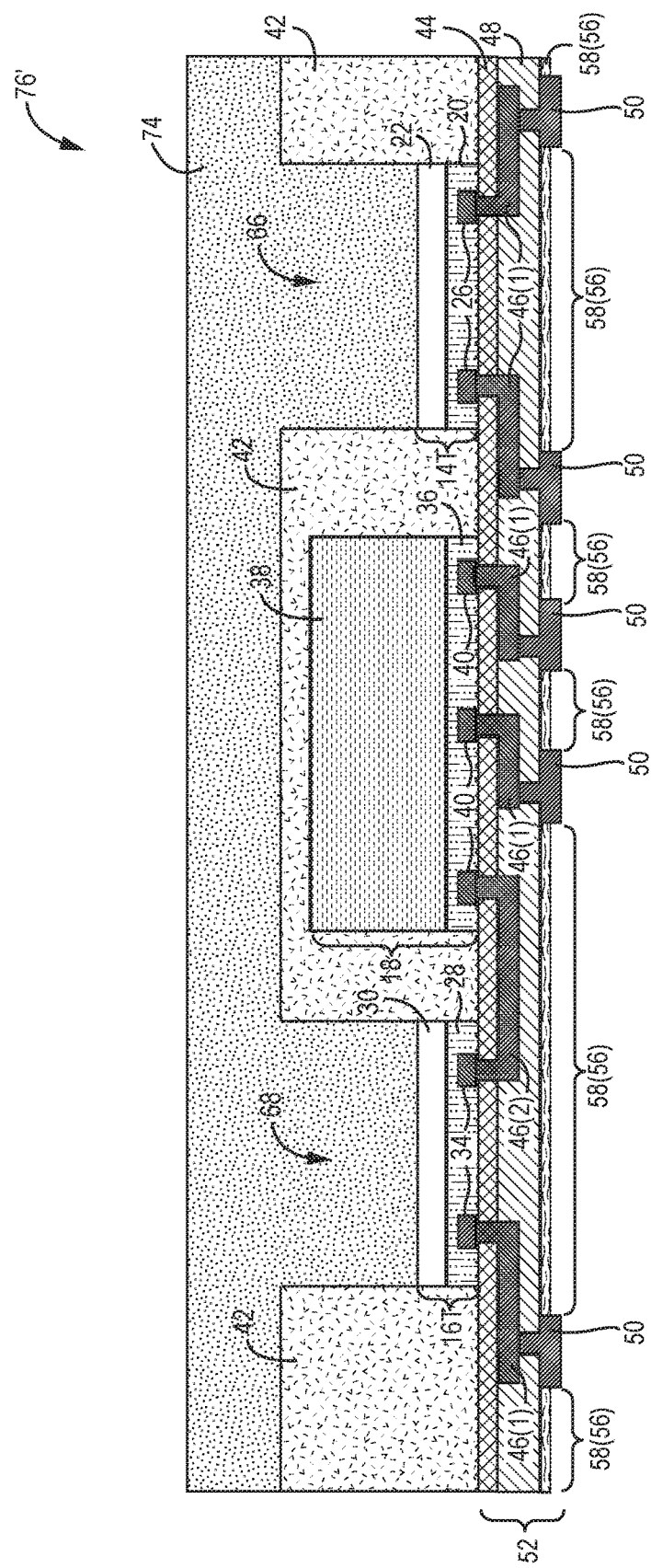
Figure 19:
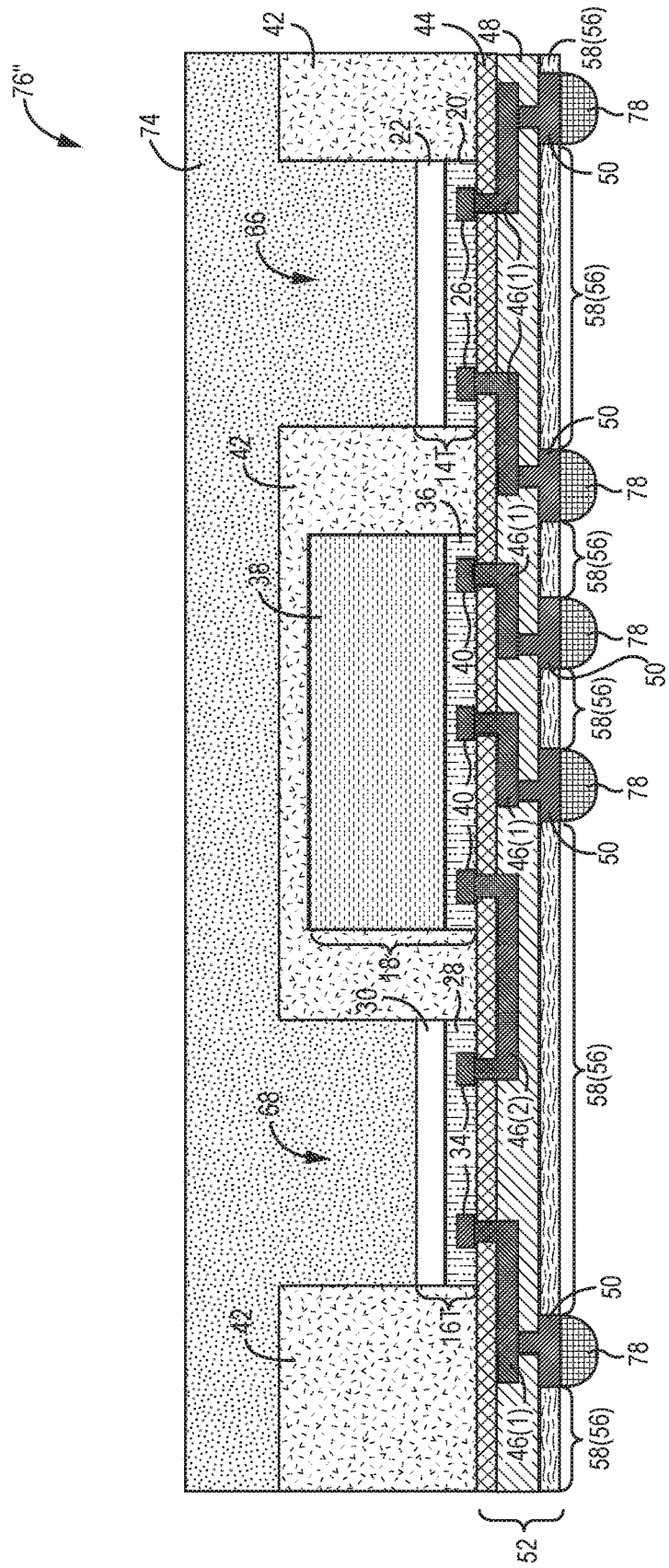

In another embodiment, after the detaching process, the bottom surface of each package contact 50 may be exposed and in a same flat plane as the bottom surface of the third dielectric layer 58 (shown in FIG. 16C). In order to complete a wafer-level package 76' with enhanced performance, at least one portion of the third dielectric layer 58 may be removed as illustrated in FIG. 18 (step 116). An etching technique may be used to remove the at least one portion of the third dielectric layer 58 to expose at least portions of the sides of each package contact 50. Herein, the third dielectric layer 58 and the second dielectric pattern 48 may be formed of different materials with different etching properties. Further, instead of removing the third layer 58, a bump 78 may be formed directly over the bottom surface of each package contact 50 to complete a wafer-level package 76" with enhanced performance, as illustrated in FIG. 19 (step 116). Consequently, each bump 78 is electrically coupled to a corresponding one of the first, second, and third die contacts 26, 34, and 40. Each bump 78 may be formed of solder alloys, such as tin or tin alloys, by a standard bumping procedure.

Figure 16D:
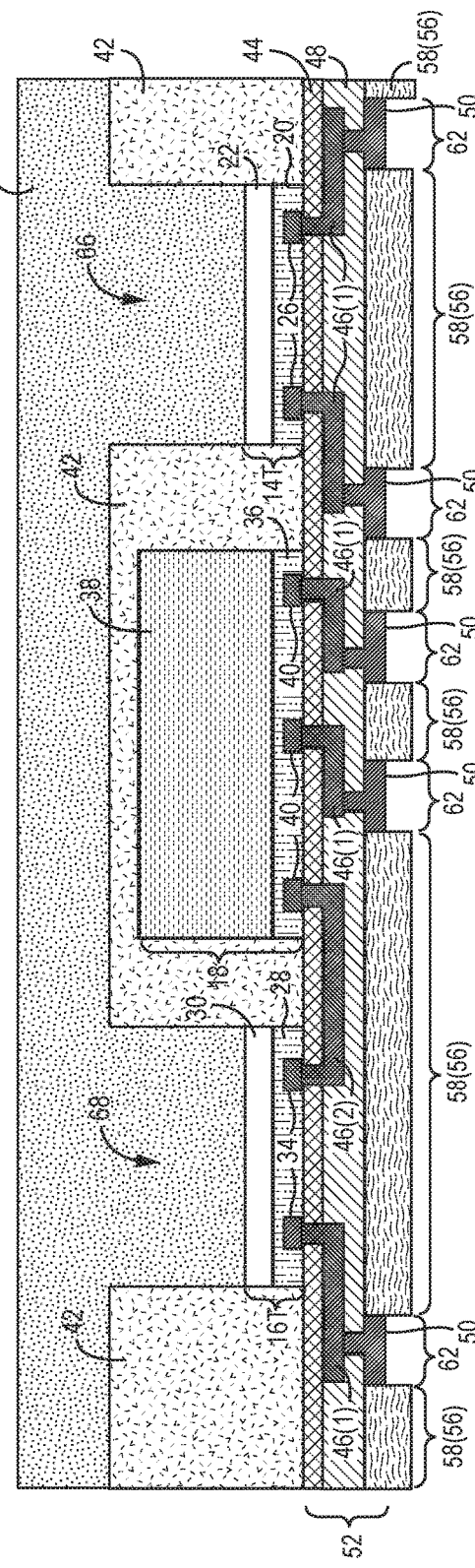
Figure 20:
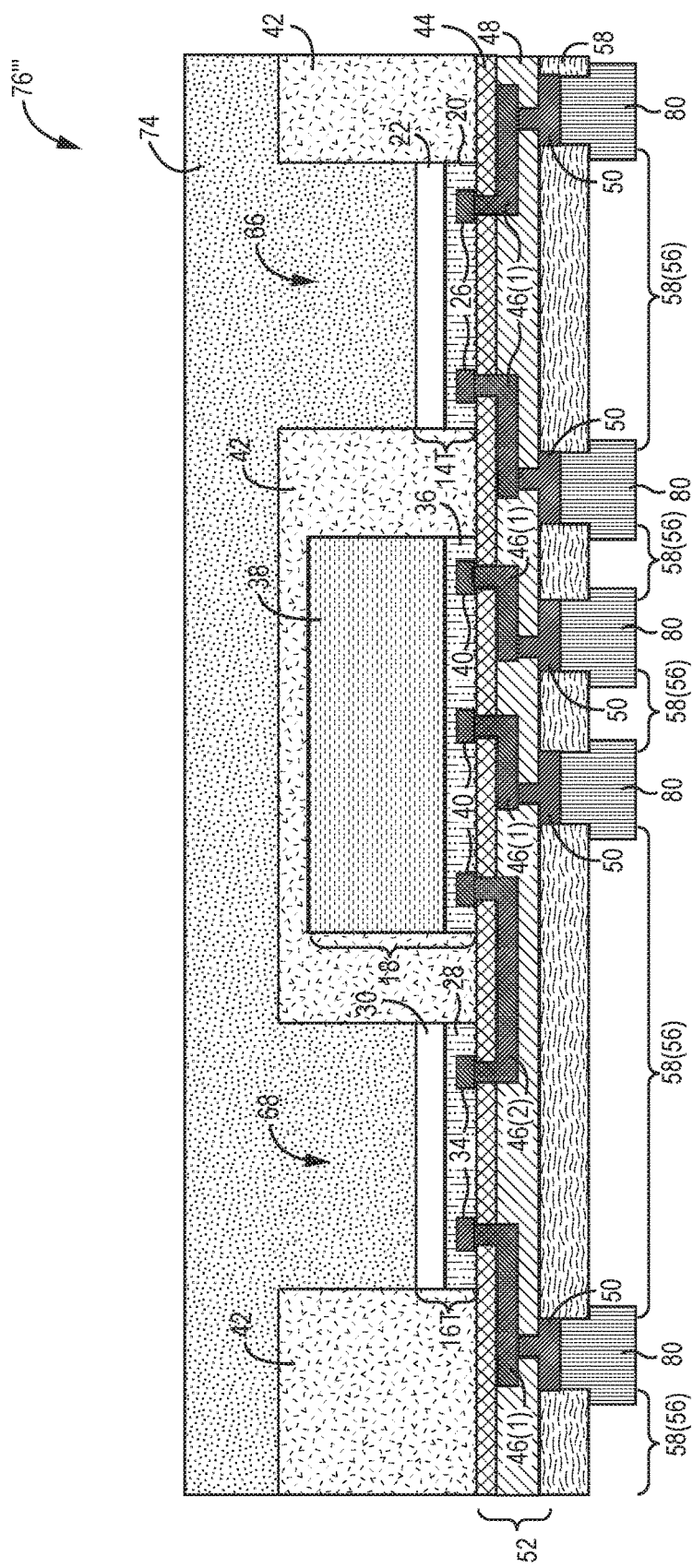

In addition, after the detaching process, the bottom surface of each package contact 50 may be exposed through the third dielectric layer 58 that is vertically beyond the bottom surface of each package contact 50 (shown in FIG. 16D). A wafer-level package 76''' may be completed by forming a number of external contacts 80 as illustrated in FIG. 20 (step 116). Each external contact 80 is in contact with a corresponding package contact 50 through the third dielectric layer 58 and extends underneath the third dielectric layer 58. Consequently, each external contact 80 is electrically coupled to a corresponding one of the first, second, and third die contacts 26, 34, and 40. The external contacts 80 may be formed of at least one of copper, nickel, gold, solder and other solderable metal.

Lastly, the wafer-level package 76/76'/76"/76''' may be marked, diced, and singulated into individual components (Step 118).

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
a first thinned die comprising a first device layer and a first dielectric layer over the first device layer, wherein the first device layer comprises a plurality of first die contacts at a bottom surface of the first device layer;
a multilayer redistribution structure comprising a first dielectric pattern, redistribution interconnects, a second dielectric pattern, and a plurality of package contacts, wherein:
the first dielectric pattern is formed underneath the first thinned die and the plurality of first die contacts is exposed through the first dielectric pattern;
the redistribution interconnects are electrically connected to the plurality of first die contacts through the first dielectric pattern and extend underneath the first dielectric pattern, wherein connections between the redistribution interconnects and the plurality of first die contacts are solder-free;
the second dielectric pattern is formed underneath the first dielectric pattern to partially encapsulate each redistribution interconnect; and
each of the plurality of package contacts is separate and on a bottom surface of the multilayer redistribution structure, wherein the redistribution interconnects connect the plurality of first die contacts to certain ones of the plurality of package contacts;
a support dielectric layer, which extends over a continuous air gap surrounding each of the plurality of package contacts, wherein at least a portion of each side of each of the plurality of package contacts is covered by the support dielectric layer, and a bottom surface of each of the plurality of package contacts is not covered by the support dielectric layer;
a first mold compound residing over the multilayer redistribution structure and around the first thinned die, and extending beyond a top surface of the first thinned die to define an opening within the first mold compound and over the first thinned die, wherein the top surface of the first thinned die is exposed at a bottom of the opening; and a second mold compound filling the opening and in contact with the top surface of the first thinned die.

2. The apparatus of claim 1 wherein the support dielectric layer encapsulates each side of each of the plurality of package contacts, and a bottom surface of the support dielectric layer and the bottom surface of each of the plurality of package contacts are in a same flat plane.

3. The apparatus of claim 2 further comprising a plurality of bumps, wherein each of the plurality of bumps is directly coupled to the bottom surface of a corresponding package contact in the plurality of package contacts.

4. The apparatus of claim 1 wherein the support dielectric layer covers a portion of each side of each of the plurality of package contacts, such that another portion of each side of each of the plurality of package contacts is exposed.

5. The apparatus of claim 1 wherein the support dielectric layer encapsulates each side of each of the plurality of package contacts, and the bottom surface of the support dielectric layer is vertically beyond the bottom surface of each of the plurality of package contacts.

6. The apparatus of claim 5 further comprising a plurality of external contacts, wherein each of the plurality of external contacts is directly coupled to the bottom surface of a corresponding package contact in the plurality of package contacts through the support dielectric layer.

7. The apparatus of claim 1 wherein a top surface of the first dielectric layer is the top surface of the first thinned die, such that the second mold compound is in contact with the top surface of the first dielectric layer.

8. The apparatus of claim 1 wherein the support dielectric layer has a planarized bottom surface.

9. The apparatus of claim 1 wherein the first thinned die provides a microelectromechanical systems (MEMS) component.

10. The apparatus of claim 1 wherein the first thinned die is formed from a silicon-on-insulator (SOI) structure, wherein the first device layer of the first thinned die is formed from a silicon epitaxy layer of the SOI structure, and the first dielectric layer of the first thinned die is a buried oxide layer of the SOI structure.

11. The apparatus of claim 1 further comprising a second intact die, wherein:

the second intact die includes a second device layer over the multilayer redistribution structure and an intact silicon substrate over the second device layer; and the first mold compound over the multilayer redistribution structure encapsulates the second intact die.

12. The apparatus of claim 11 wherein the first thinned die provides a MEMS component and the second intact die provides a complementary metal-oxide-semiconductor (CMOS) controller that controls the MEMS component.

13. The apparatus of claim 1 wherein the second mold compound has a thermal conductivity greater than 2 W/m·K.

14. The apparatus of claim 1 wherein the second mold compound has an electrical resistivity greater that 1E6 Ohm·cm.

15. The apparatus of claim 1 wherein the first mold compound is formed from a same material as the second mold compound.

16. The apparatus of claim 1 wherein the first mold compound and the second mold compound are formed from different materials.

17. The apparatus of claim 1 wherein the multilayer redistribution structure is free of glass fiber.

* * * * *